United States Patent
Kim et al.

(10) Patent No.: US 8,497,555 B2
(45) Date of Patent: Jul. 30, 2013

(54) VERTICAL MEMORY DEVICES INCLUDING INDIUM AND/OR GALLIUM CHANNEL DOPING

(75) Inventors: Jin-Gyun Kim, Yongin-si (KR); Ki-Hyun Hwang, Seongnam-si (KR); Sung-Hae Lee, Suwon-si (KR); Ji-Hoon Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 75 days.

(21) Appl. No.: 13/298,728

(22) Filed: Nov. 17, 2011

(65) Prior Publication Data

US 2012/0153291 A1    Jun. 21, 2012

(30) Foreign Application Priority Data

Dec. 20, 2010   (KR) .................... 10-2010-0130396

(51) Int. Cl.
*H01L 29/792* (2006.01)
*G11C 11/40* (2006.01)

(52) U.S. Cl.
CPC .................. *H01L 29/7926* (2013.01)
USPC ............. 257/390; 257/401; 257/E27.081; 257/E27.107; 257/E29.255; 257/E29.262; 257/E29.309; 365/72; 365/184

(58) Field of Classification Search
CPC .................................. H01L 29/7926
USPC ................... 257/390, 401; 365/72, 184
See application file for complete search history.

(56) References Cited

U.S. PATENT DOCUMENTS

| | | | |
|---|---|---|---|
| 6,992,349 B2 * | 1/2006 | Lee et al. ................ | 257/324 |
| 7,848,145 B2 * | 12/2010 | Mokhlesi et al. ........ | 365/185.17 |
| 7,851,851 B2 * | 12/2010 | Mokhlesi et al. ........ | 257/326 |
| 2008/0179659 A1 | 7/2008 | Enda et al. | |
| 2009/0173981 A1 | 7/2009 | Nitta | |
| 2010/0308391 A1 * | 12/2010 | Kim et al. ............... | 257/314 |
| 2011/0101298 A1 * | 5/2011 | Tang et al. ............... | 257/5 |
| 2011/0201167 A1 * | 8/2011 | Satonaka et al. ........ | 438/268 |
| 2011/0294290 A1 * | 12/2011 | Nakanishi et al. ....... | 438/666 |
| 2011/0298037 A1 * | 12/2011 | Choe et al. .............. | 257/324 |
| 2012/0086072 A1 * | 4/2012 | Yun et al. ................. | 257/329 |
| 2012/0139027 A1 * | 6/2012 | Son et al. ................. | 257/324 |
| 2012/0199877 A1 * | 8/2012 | Liu et al. .................. | 257/192 |
| 2012/0244673 A1 * | 9/2012 | Shinohara et al. ....... | 438/287 |
| 2012/0256247 A1 * | 10/2012 | Alsmeier .................. | 257/319 |
| 2012/0256253 A1 * | 10/2012 | Hwang et al. ........... | 257/329 |

FOREIGN PATENT DOCUMENTS

| | | |
|---|---|---|
| JP | 10-093083 | 4/1998 |
| JP | 2009-164485 | 7/2009 |
| KR | 1020080070583 | 7/2008 |

* cited by examiner

*Primary Examiner* — Evan Pert
(74) *Attorney, Agent, or Firm* — Myers Bigel Sibley & Sajovec, P.A.

(57) ABSTRACT

A vertical memory device may include a substrate, a first selection line on the substrate, a plurality of word lines on the first selection line, a second selection line on the plurality of word lines, and a semiconductor channel. The first selection line may be between the plurality of word lines and the substrate, and the plurality of word lines may be between the first and second selection lines. Moreover, the first and second selection lines and the plurality of word lines may be spaced apart in a direction perpendicular with respect to a surface of the substrate. The semiconductor channel may extend away from the surface of the substrate adjacent sidewalls of the first and second selection lines and the plurality of word lines. In addition, portions of the semiconductor channel adjacent the second selection line may be doped with indium and/or gallium. Related methods are also discussed.

12 Claims, 32 Drawing Sheets

FIG. 2
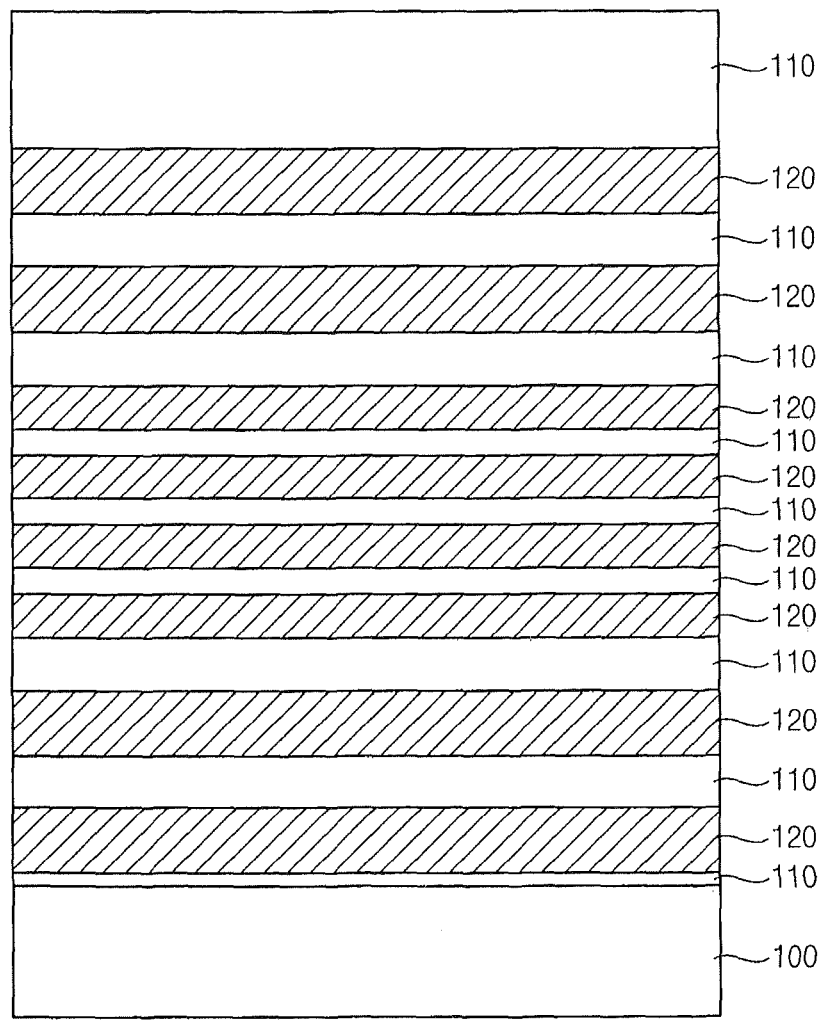
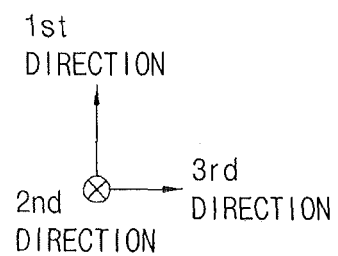

FIG. 12
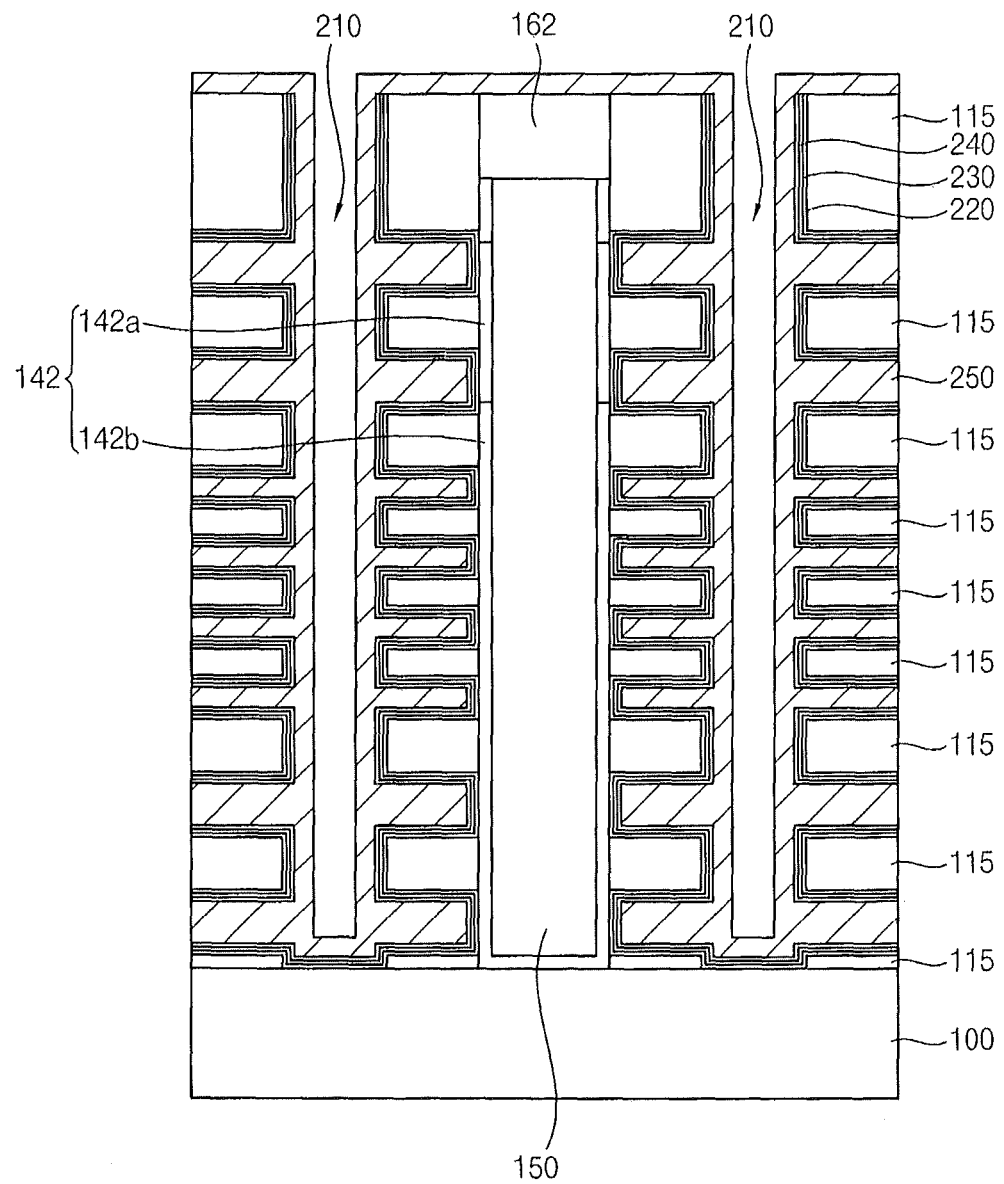
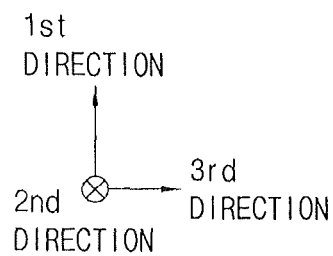

FIG. 16A
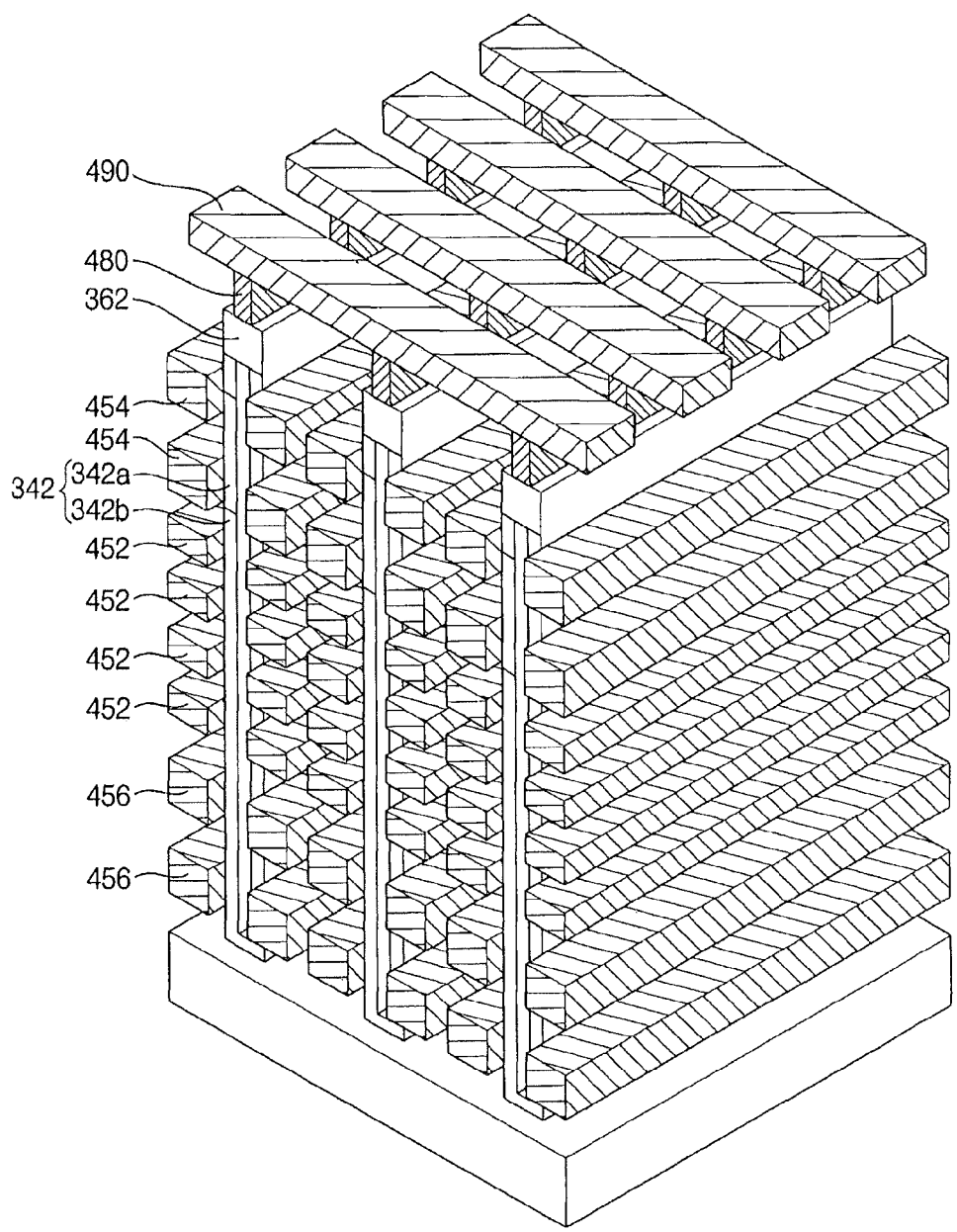
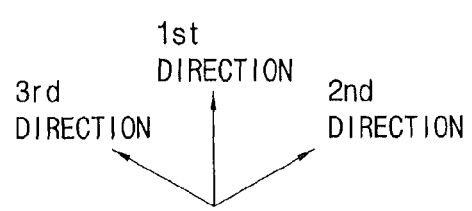

FIG. 17
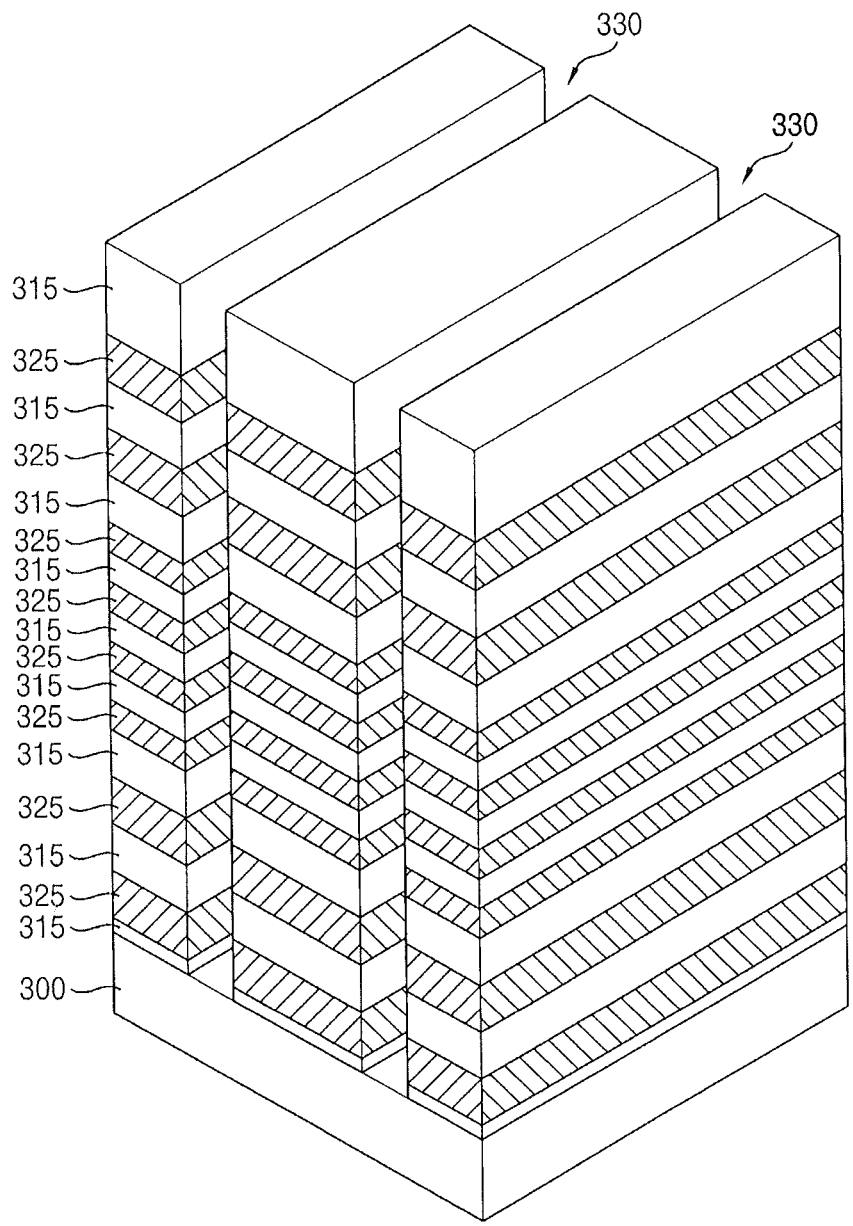
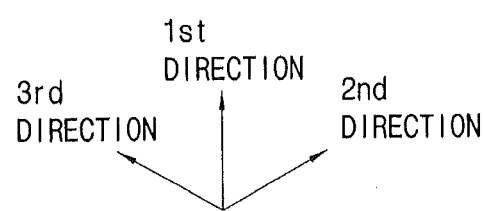

FIG. 18
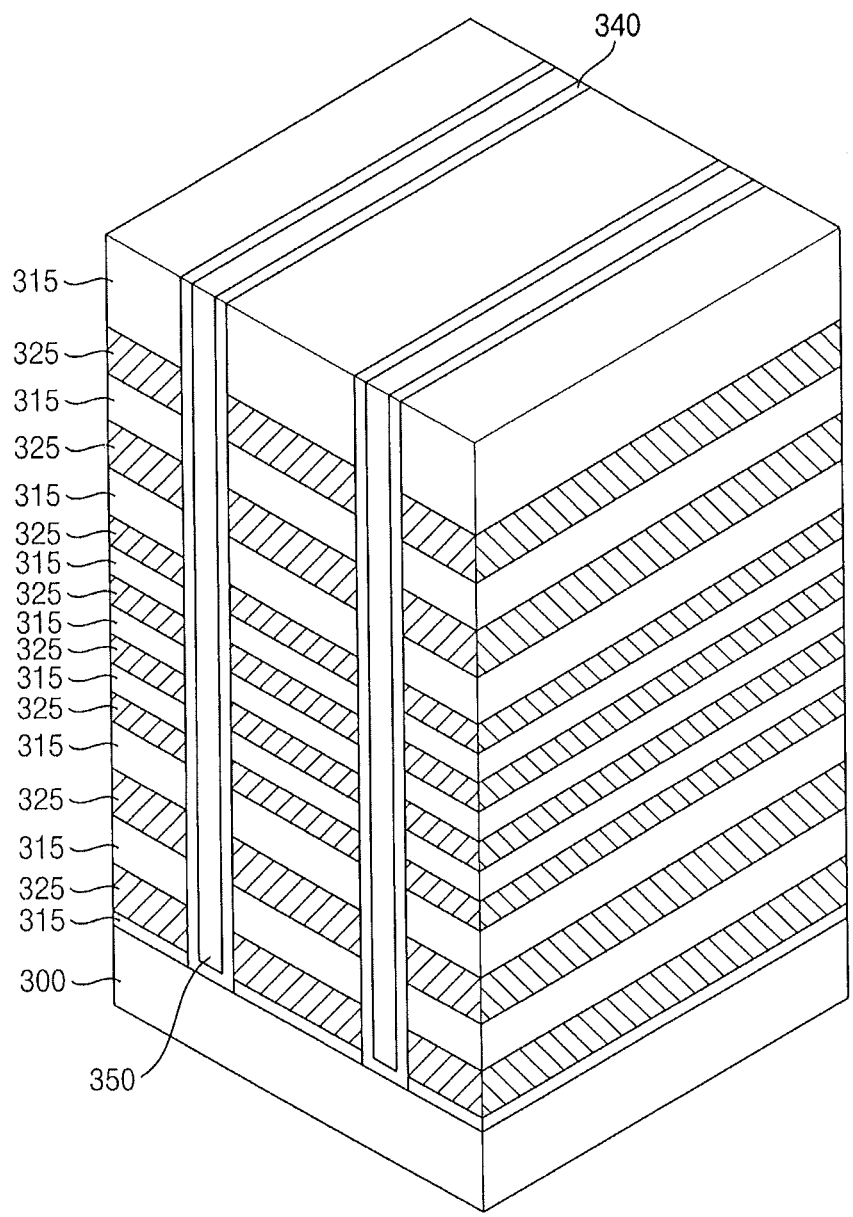
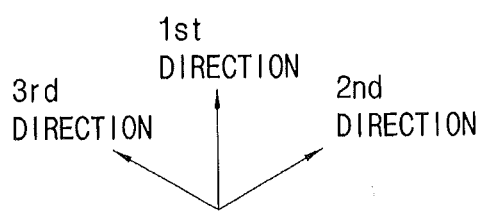

FIG. 19
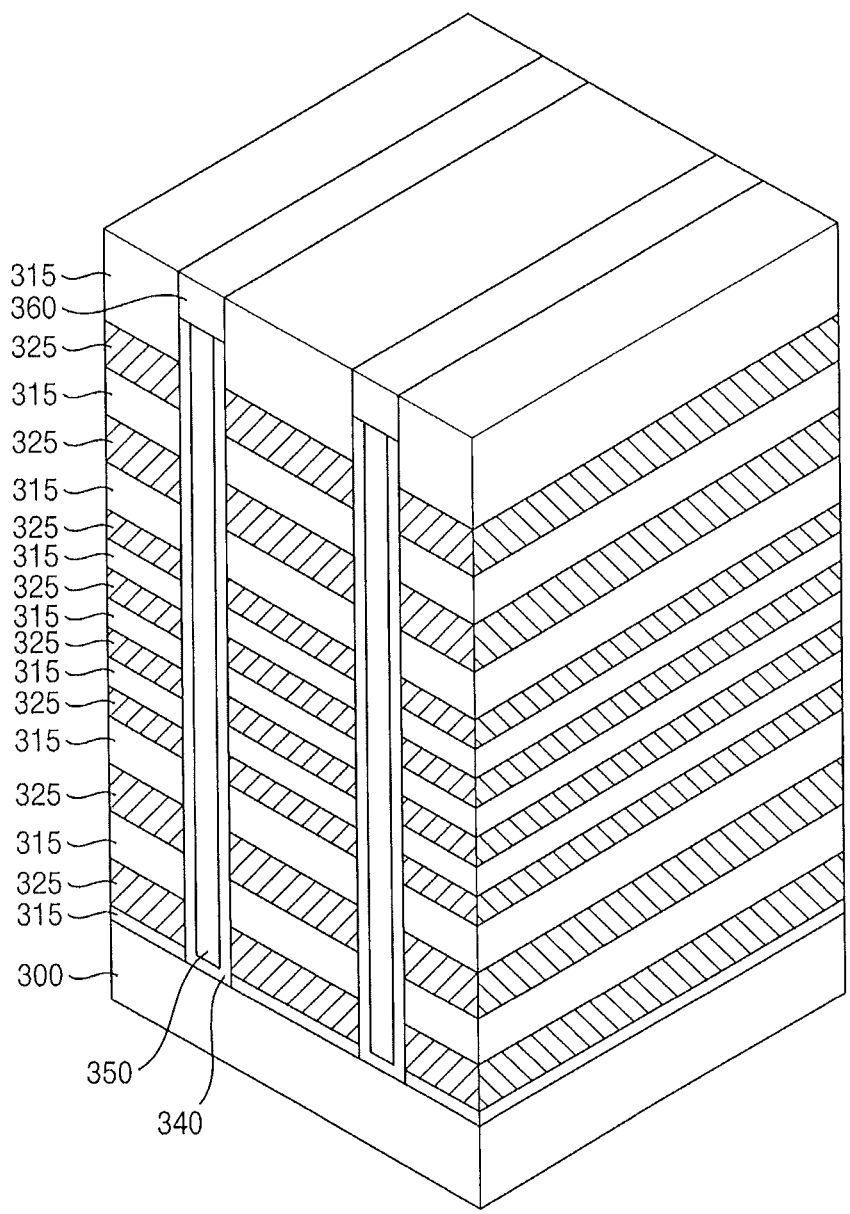
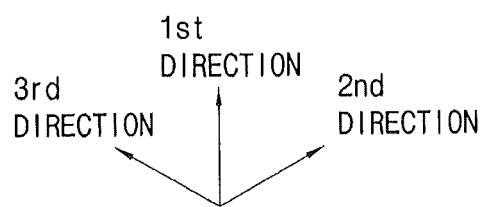

FIG. 20
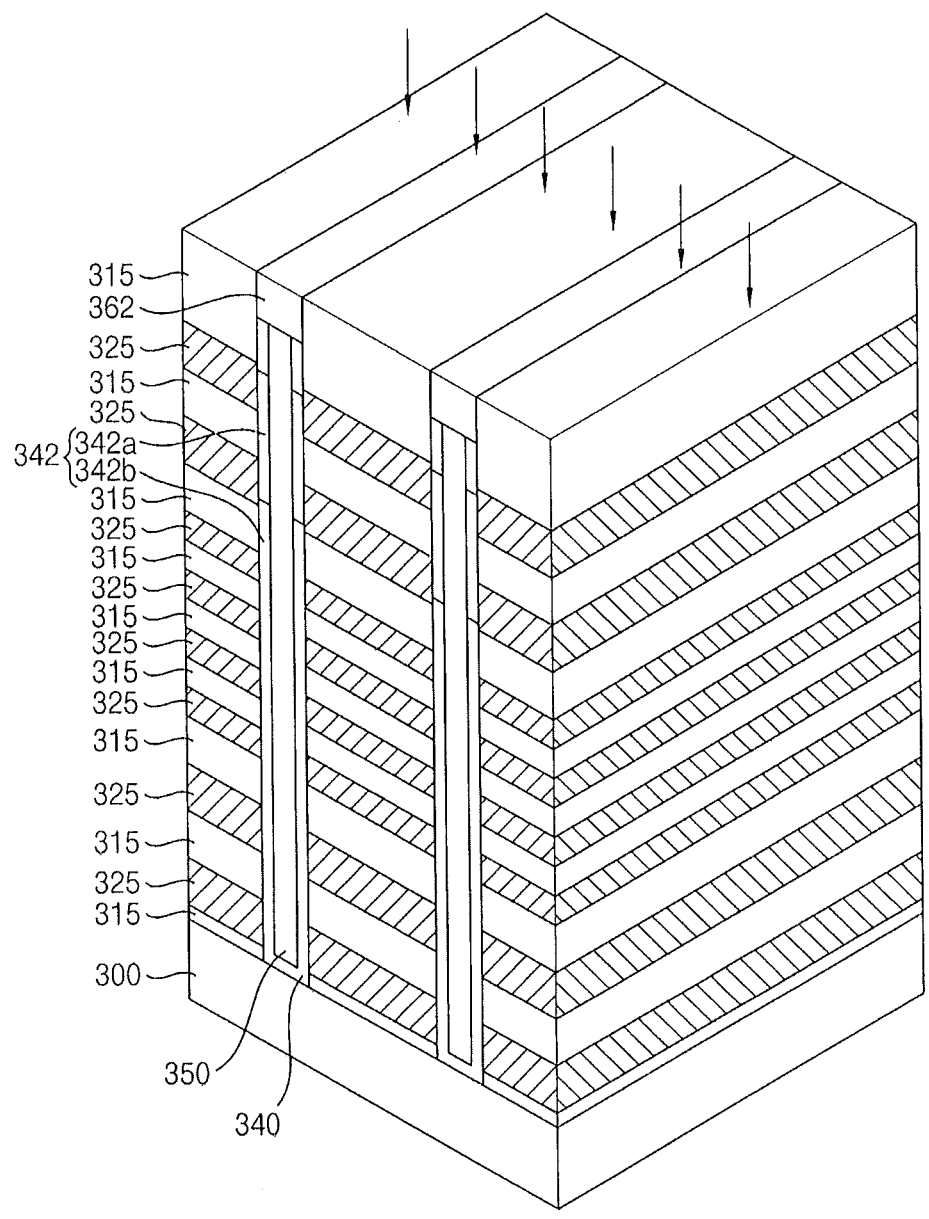
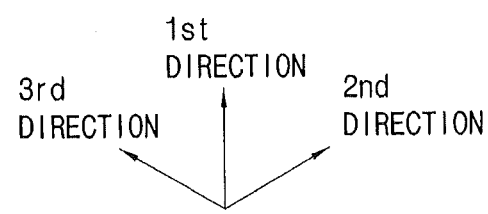

FIG. 21
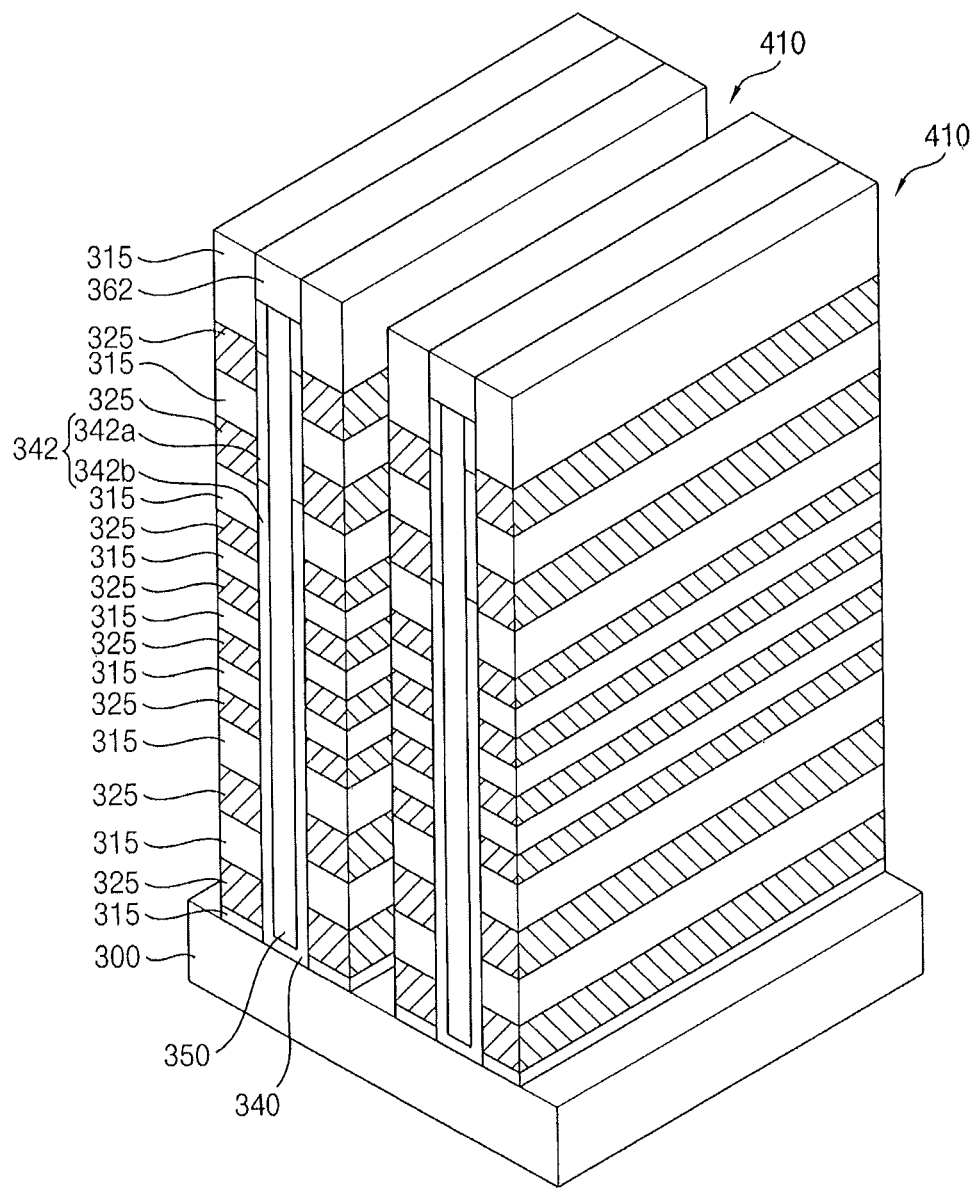
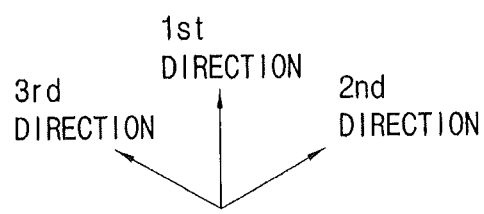

FIG. 22
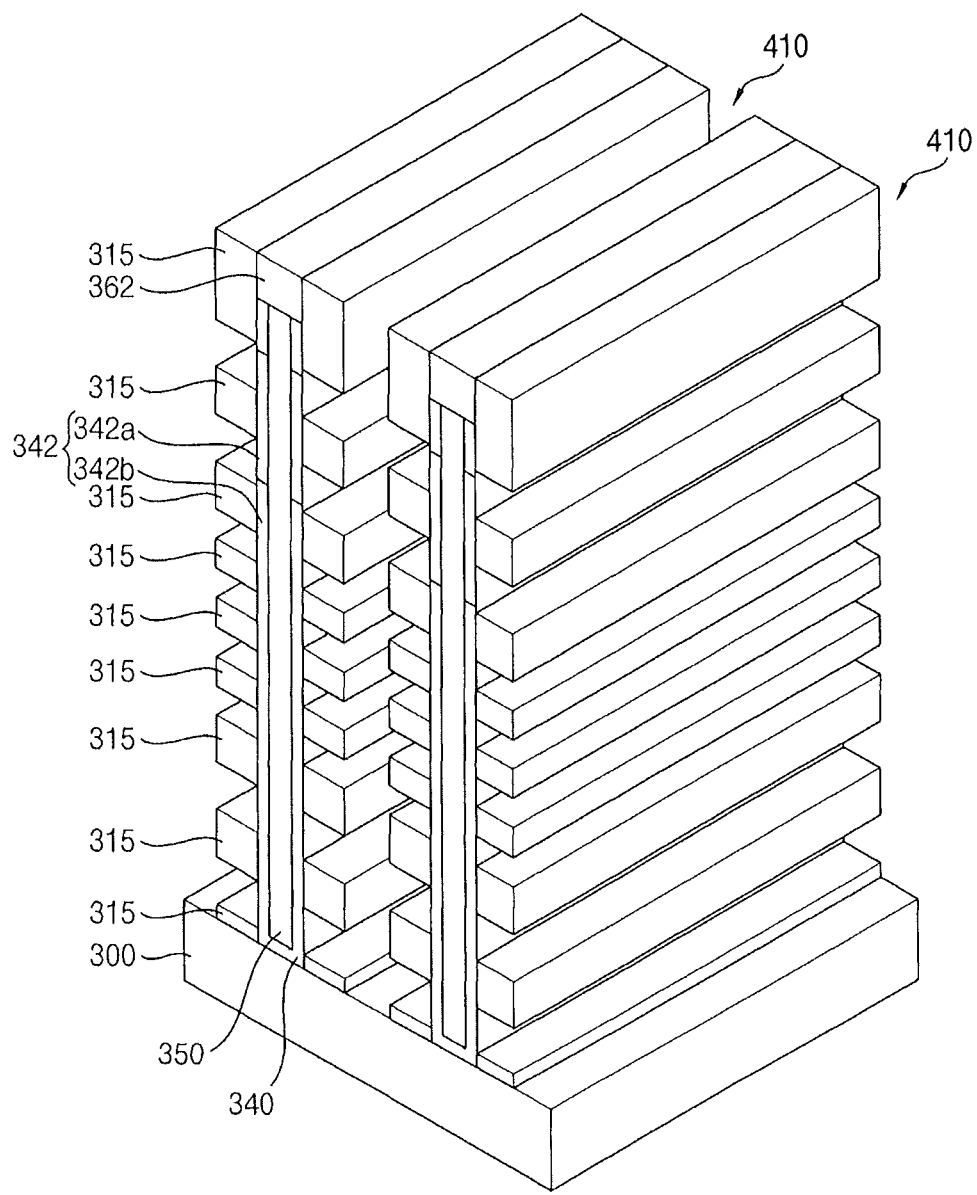
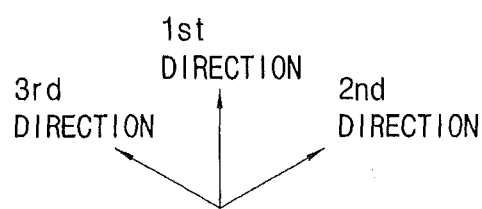

VERTICAL MEMORY DEVICES INCLUDING INDIUM AND/OR GALLIUM CHANNEL DOPING

CROSS-REFERENCE TO RELATED APPLICATION

This application claims the benefit of priority under 35 USC §119 to Korean Patent Application No. 10-2010-0130396 filed on Dec. 20, 2010, in the Korean Intellectual Property Office (KIPO), the entire disclosure of which is incorporated herein by reference.

BACKGROUND

1. Field

Example embodiments relate to vertical memory devices and methods of manufacturing the same.

2. Description of the Related Art

Vertical memory devices may increase integration density in comparison to planar devices. In a method of manufacturing a vertical memory device, after alternately depositing a plurality of memory cells and insulation layers, the memory cells and the insulation layers are etched to form an opening. Polysilicon is deposited in the opening and impurities are implanted therein to form a channel and a pad. Threshold voltages of the channels and/or the pad currents may vary according to variations of doping profiles of the impurities. A more uniform doping of impurities may thus be desired.

SUMMARY

Example embodiments may provide vertical memory devices having channels and pads in which impurities are more uniformly doped and/or methods of manufacturing vertical memory devices having more uniformly doped channels and pads.

According to example embodiments, a vertical memory device may be provided. The device may include at least one ground selection line (GSL), a plurality of word lines, and at least one string selection line (SSL) spaced apart from each other on a substrate in a first direction substantially perpendicular to a top surface of a substrate. A channel may extend in the first direction on sidewalls of the at least one GSL, the word lines, and the at least one SSL, and the channel may include polysilicon doped with indium and/or gallium at a portion thereof adjacent to the SSL.

The channel may be further doped with carbon at the portion thereof adjacent to the SSL.

The semiconductor device may further include a polysilicon pad doped with carbon and phosphorous on the channel. The pad may include a first polysilicon pad layer doped with carbon and phosphorous, and a second polysilicon pad layer doped with phosphorous on the first polysilicon pad layer.

The semiconductor device may further include a polysilicon pad doped with arsenic on the channel.

The channel may be cup shaped, or the channel may have a linear or bar shape extending in the first direction.

The semiconductor device may further include a common source line (CSL) extending in a second direction substantially parallel to the top surface of the substrate at an upper portion of the substrate, and a bit line extending in a third direction substantially orthogonal to the second direction and electrically connected to the pad.

The semiconductor device may further include a tunnel insulation layer pattern, a charge trapping layer pattern, and a blocking layer pattern sequentially stacked in a second direction substantially perpendicular to a sidewall of the channel. The tunnel insulation layer pattern, the charge trapping layer pattern, and the blocking layer pattern may be between the sidewall of the channel and each of the GSL, the word lines, and the SSL.

According to example embodiments, a method of manufacturing a vertical memory device may include forming a channel extending in a first direction substantially perpendicular to a top surface of the substrate and including polysilicon partially doped with indium or gallium. At least one ground selection line (GSL), a plurality of word lines, and at least one string selection line (SSL) may be formed spaced apart on a sidewall of the channel in the first direction.

A preliminary channel may be formed using polysilicon, and a portion of the preliminary channel may be doped with indium and/or gallium. The portion of the preliminary channel doped with indium and/or gallium may be adjacent to the SSL. In addition, carbon may be further doped into the portion of the preliminary channel. Prior to doping the portion of the preliminary channel with indium and/or gallium, silicon ions and/or germanium ions may be implanted into the preliminary channel to amorphousize the preliminary channel.

Prior to forming the GSL, the word lines, and the SSL, a polysilicon pad doped with carbon and phosphorous may be further formed on the channel to be electrically connected to the channel.

The channel and the pad may be formed using impurities having low diffusion characteristics, so that diffusion in subsequent processes, e.g., heat treatments may be reduced or prevented. Thus, the channel and the pad may have a relatively uniform doping profile.

That is, indium and/or gallium having low diffusion characteristics may be doped into at least a portion of the preliminary channel adjacent to the SSL to form the channel having a relatively uniform doping profile, and carbon may be further doped so that diffusion may be further reduced or prevented. Thus, the vertical memory device may have a relatively low threshold voltage distribution. Additionally, phosphorus or arsenic may be doped into the preliminary pad doped with carbon to form the pad, so that the pad may have a relatively uniform doping profile. After doping phosphorous or arsenic, instead of a long heat treatment, a rapid thermal annealing may be performed so that the relatively uniform doping profile may be maintained. Thus, the vertical memory device may have a low source/drain resistance distribution.

According to some other example embodiments, a vertical memory device may include a substrate, a first selection line on the substrate, a plurality of word lines on the first selection line, a second selection line on the plurality of word lines, and a semiconductor channel. The first selection line may be between the plurality of word lines and the substrate, and the plurality of word lines may be between the first and second selection lines. More particularly, the first and second selection lines and the plurality of word lines may be spaced apart in a direction perpendicular with respect to a surface of the substrate. The semiconductor channel may extend away from the surface of the substrate adjacent sidewalls of the first and second selection lines and the plurality of word lines, and portions of the semiconductor channel adjacent the second selection line may be doped with indium and/or gallium.

According to still other example embodiments, a method of forming a vertical memory device may include forming a semiconductor channel on a substrate and forming a first selection line, a plurality of word lines, and a second selection line. The semiconductor channel may extend away from a surface of the substrate, with a portion of the semiconductor channel being doped with indium and/or gallium. The first selection line, the plurality of word lines, and the second selection line may be spaced apart in a direction perpendicular with respect to the surface of the substrate, with sidewalls of the first selection line, the plurality of word lines, and the second selection line being adjacent the semiconductor channel.

BRIEF DESCRIPTION OF THE DRAWINGS

Example embodiments will be more clearly understood from the following detailed description taken in conjunction with the accompanying drawings. FIGS. 1A-29 represent non-limiting, example embodiments as described herein.

FIGS. 1A, 1B and 1C are a perspective diagram, a local perspective diagram and a cross-sectional view, respectively, illustrating vertical memory devices in accordance with example embodiments;

FIGS. 2-14 are cross-sectional views illustrating operations of manufacturing a vertical memory device of FIG. 1 in accordance with example embodiments;

FIG. 15 is a cross-sectional view illustrating vertical memory devices in accordance with other example embodiments;

FIGS. 16A and 16B are perspective and local perspective diagrams, respectively, illustrating vertical memory devices in accordance with still other example embodiments;

FIGS. 17-28 are perspective diagrams illustrating operations of manufacturing a vertical memory device of FIG. 24 in accordance with example embodiments; and FIG. 29 is a perspective diagram illustrating vertical memory devices in accordance with still other example embodiments.

Figure 1A:
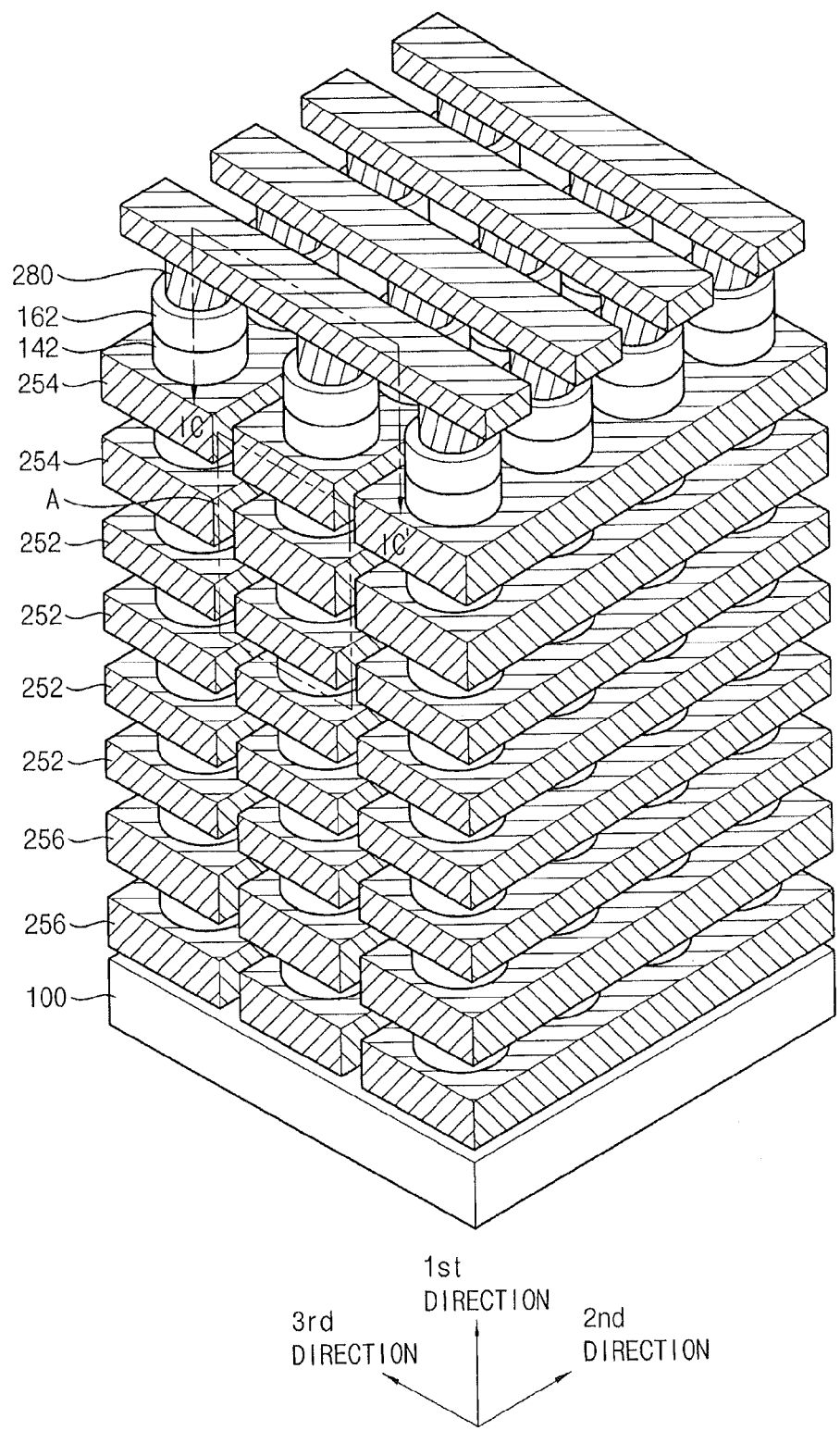

It should be noted that these figures are intended to illustrate general characteristics/operations of methods, structures, and/or materials used in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be increased, reduced, and/or or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as limited to the example embodiments set forth herein; rather, these example embodiments are provided so that this description will be thorough and complete, and will fully convey concepts of example embodiments to those of ordinary skill in the art. In the drawings, thicknesses of layers and regions may be exaggerated for clarity. Like reference numerals in the drawings denote like elements, and thus repeated description thereof may be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of present inventive concepts.

Unless otherwise defined, all terms (including technical and scientific terms) used herein have the same meaning as commonly understood by one of ordinary skill in the art to which inventive concepts herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
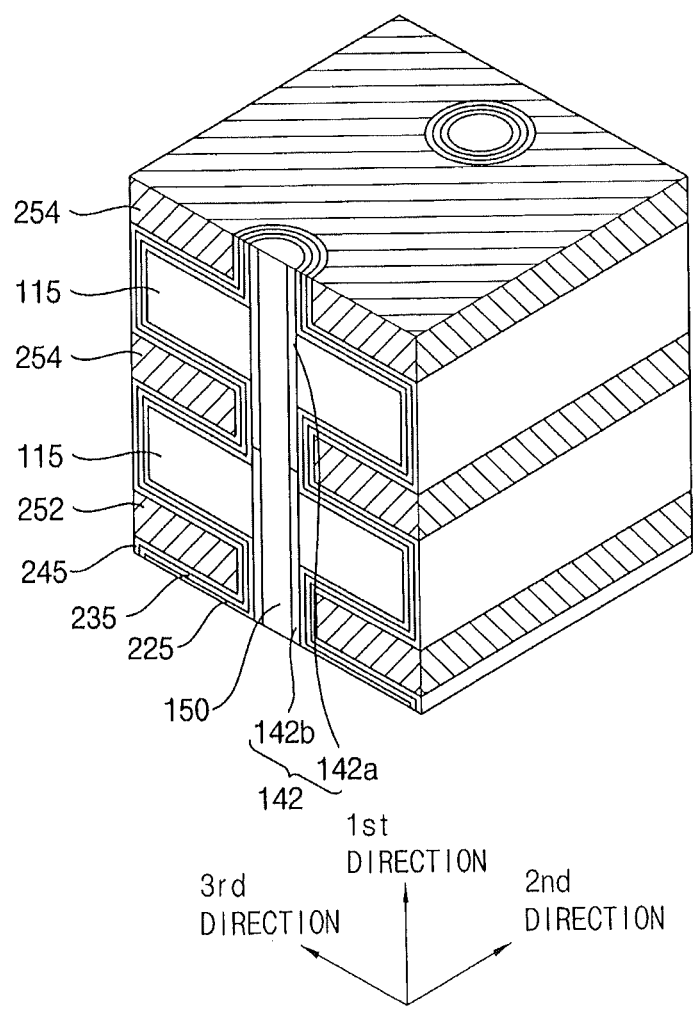
Figure 1C:
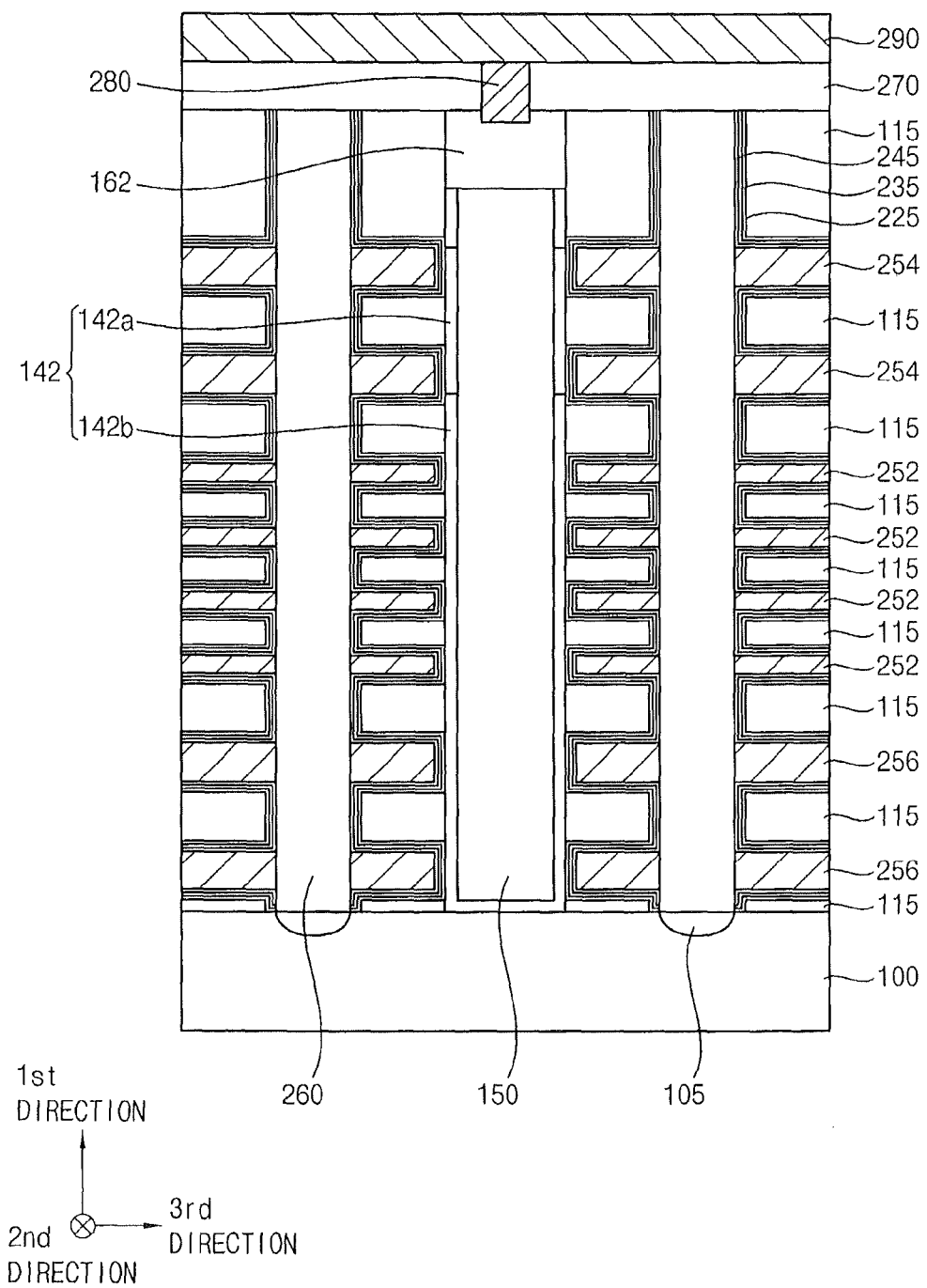

FIGS. 1A, 1B and 1C are a perspective diagram, a local perspective diagram, and a cross-sectional view, respectively, illustrating vertical memory devices in accordance with example embodiments. FIG. 1B is a local perspective diagram of region A of a vertical memory device in FIG. 1A, and FIG. 1C is a cross-sectional view of a vertical memory device in FIG. 1A cut along the line IC-IC'.

Referring to FIGS. 1A, 1B and 1C, a vertical memory device may include a ground selection line (GSL) 256, a word line 252, and a string selection line (SSL) 254 that are spaced apart from each other along a first direction substantially perpendicular to a top surface of a substrate 100, and a channel 142 extending from the substrate 100 in the first direction on sidewalls of the GSL 256, the word line 252, and the SSL 254. The vertical memory device may further include a bit line 290 electrically connected to the channel 142, and an impurity region 105 serving as a common source line (CSL). The bit line 290 may be electrically connected to the channel 142 via a pad 162 and a bit line contact 280.

According to example embodiments, the channel 142 may include, for example, polysilicon or doped polysilicon.

The channel 142 may include a first channel layer 142a adjacent to the SSL 254, and a second channel layer 142b that is not adjacent to the SSL 254. According to example embodiments, the channel 142 may include polysilicon doped with p-type impurities, e.g., polysilicon doped with indium and/or gallium. The first channel layer 142a may further include carbon and/or germanium.

According to example embodiments, a plurality of channels 142 may be provided in a second direction substantially parallel to the top surface of the substrate 100 to define channel columns, and a plurality of channel columns may be formed in a third direction substantially perpendicular to the second direction to define a channel array.

According to example embodiments, the channel 142 may be cup shaped and/or of a hollow cylindrical shape. Stated in other words, the channel 142 may be hollow when viewed in a cross section taken perpendicular and/or parallel with respect to the surface of the substrate.

A filling layer pattern 150 may be formed in a space defined by an inner sidewall of the, for example, cup shaped channel 142. The filling layer pattern 152 may include, for example, an insulating material (e.g., an oxide).

A pad 162 may be on the filling layer pattern 150 and the channel 142, and may electrically connect the channel 142 to the bit line contact 280. The pad 162 may serve as a source/drain region by which charges may be moved through the channel 142.

The pad 162 may include doped polysilicon. According to example embodiments, the pad 162 may include polysilicon doped with impurities, e.g., phosphorous, arsenic, etc. When the pad 162 includes polysilicon doped with phosphorous, the pad 162 may further include carbon.

Each of the GSL(s) 256, the word line(s) 252, and the SSL(s) 254 may be at a single level (e.g., one of each, each at a different height) or more than one level, and a first insulation layer pattern 115 may be provided therebetween. According to at least one example embodiment, the GSL(s) 256 and the SSL(s) 254 may be at 2 levels (e.g., two of each at different heights), respectively, and the word line(s) 252 may be at 4 levels between the GSL 256 and the SSL 254. However, the GSL 256 and the SSL 254 may be at one level, and the word line(s) 252 may be formed at 2, 8, or 16 levels. According to example embodiments, each of the GSL(s) 256, the word line(s) 252, and the SSL(s) 254 may extend in the second direction, and a plurality of GSLs 256, a plurality of word lines 252, and a plurality of SSLs 254 may be spaced apart in the third direction. The first insulation layer pattern(s) 115 may include, for example, silicon oxide (e.g., silicon dioxide ($SiO_2$), silicon oxycarbide (SiOC), and/or silicon oxyfluoride (SiOF)).

A tunnel insulation layer pattern 225, a charge trapping layer pattern 235, and a blocking layer pattern 245 may be between each of the GSL(s) 256, the word line(s) 252, and the SSL(s) 254, and an outer sidewall of the channel 142 in a direction substantially perpendicular to the outer sidewall of the channel 142. The tunnel insulation layer pattern 225, the charge trapping layer pattern 235, and the blocking layer pattern 245 may be between each of the GSL(s) 256, the word line(s) 252 and the SSL(s) 254, and the first insulation layer pattern 115 and/or on a sidewall of the first insulation layer pattern 115. According to at least one example embodiment, the tunnel insulation layer pattern 225 may be only on the outer sidewall of the channel 142.

According to example embodiments, the GSL(s) 256, the word line(s) 252, and the SSL(s) 254 may include, for example, a metal and/or a metal nitride. For example, the GSL(s) 256, the word line(s) 252, and the SSL(s) 254 may include a metal and/or a metal nitride with low electrical resistance (e.g., tungsten, tungsten nitride, titanium, titanium nitride, tantalum, tantalum nitride, and/or platinum). According to at least one example embodiment, each of the GSL(s) 256, the word line(s) 252, and the SSL(s) 254 may be a multi-layered structure including, for example, a barrier layer, a metal nitride layer, and/or a metal layer including a metal.

According to example embodiments, the tunnel insulation layer pattern 225 may include silicon oxide, and the charge trapping layer pattern 235 may include a nitride (e.g., silicon nitride) and/or a metal oxide. According to example embodiments, the blocking layer pattern 245 may include silicon oxide and/or a metal oxide (e.g., aluminum oxide, hafnium oxide, lanthanum oxide, lanthanum aluminum oxide, lanthanum hafnium oxide, hafnium aluminum oxide, titanium oxide, tantalum oxide, and/or zirconium oxide). According to at least one example embodiment, the blocking layer pattern 245 may be a multi-layered structure including a silicon oxide layer and a metal oxide layer.

A second insulation layer pattern(s) 260 may be between structures including the GSL(s) 256, the word line(s) 252, and the SSL(s) 254, and the second insulating layer pattern(s) may extend in the second direction with the first insulation layer pattern(s) 115 therebetween. The second insulation layer pattern(s) 260 may include an insulating material (e.g., an oxide). The impurity region 105 may be at an upper portion of the substrate 100 beneath the second insulation layer pattern 260, which may extend in the second direction and serve as a CSL. According to example embodiments, the impurity region 105 may include n-type impurities, for example, phosphorus and/or arsenic.

The bit line 290 may be electrically connected to the pad 162 via the bit line contact 280, and may thus be electrically connected to the channel 142. The bit line 290 may include, for example, a metal, a metal nitride and/or doped polysilicon. According to example embodiments, the bit line 290 may extend in the third direction.

The bit line contact 280 may extend through a third insulation layer 270, and contact the pad 162. The bit line contact 280 may include, for example, a metal, a metal nitride, and/or doped polysilicon.

The third insulation layer 270 may be on the first and second insulation layer patterns 115 and 260, the channel(s) 142, the pad(s) 162, the blocking layer pattern(s) 245, the charge trapping layer pattern(s) 235, and the tunnel insulation layer pattern(s) 225. According to example embodiments, the third insulation layer 270 may include an insulating material, such as an oxide.

The vertical memory device may have the first channel layer 142a including polysilicon doped with indium and/or gallium, and the first channel layer 142a may have a uniform doping profile adjacent to the SSL 254. Thus, the vertical memory device may have a reduced threshold voltage distribution among a plurality of channels 142. Additionally, the vertical memory device may have pad(s) 162 including polysilicon doped with carbon and phosphorous and/or doped with carbon and arsenic, and pad(s) 162 may have a uniform doping profile. Thus, the vertical memory device may have a reduced resistance distribution among a plurality of source/drain regions.

FIGS. 2-14 are cross-sectional diagrams illustrating methods of manufacturing a vertical memory device of FIG. 1 in accordance with example embodiments.

Referring to FIG. 2, a first insulation layer(s) 110 and a sacrificial layer(s) 120 may be alternately and repeatedly formed on a substrate 100. A plurality of first insulation layers 110 and a plurality of sacrificial layers 120 may be alternately formed on each other at a plurality of levels, respectively. The substrate 100 may include a semiconductor material, for example, silicon and/or germanium. The substrate 100 may be, for example, a bulk semiconductor substrate or a semiconductor layer.

According to example embodiments, the first insulation layer(s) 110 and the sacrificial layer 120 may be formed, for example, using chemical vapor deposition (CVD), plasma enhanced chemical vapor deposition (PECVD), and/or atomic layer deposition (ALD). The first insulation layer 110, which may be formed directly on a top surface of the substrate 100, may be formed, for example, using thermal oxidation. According to example embodiments, the first insulation layer 110 may be formed to include a silicon oxide, for example, silicon dioxide ($SiO_2$), silicon oxycarbide (SiOC), and/or silicon oxyfluoride (SiOF). The sacrificial layer(s) 120 may be formed to include, for example, a material with etch selectivity with respect to the first insulation layer 110 (e.g., silicon nitride and/or silicon boronitirde).

According to example embodiments, the sacrificial layer(s) 120 at a level(s) at which a GSL 256 (refer to FIG. 13) or an SSL 254 (refer to FIG. 13) may be formed may have a thickness greater than that of the sacrificial layer(s) 120 at a level(s) at which a word line(s) 252 (refer to FIG. 13) may be formed. The first insulation layer(s) 110 adjacent to the sacrificial layer(s) 120 at which the GSL(s) 256 or the SSL(s) 254 may be formed have a thickness greater than that of the first insulation layer(s) 110 adjacent to the sacrificial layer(s) 120 at which the word line(s) 252 may be formed.

The number of the first insulation layer(s) 110 and the number of the sacrificial layer(s) 120 stacked on the substrate 100 may vary according to a desired number of GSL(s) 256, word line(s) 252, and SSL(s) 254. According to at least one example embodiment, each of GSL(s) 256 and SSL(s) 254 may be formed at 2 levels, and word line(s) 252 may be formed at 4 levels. Sacrificial layer(s) 120 may be formed at 8 levels, and first insulation layer(s) 110 may be formed at 9 levels. According to at least one example embodiment, each of GSL(s) 256 and SSL(s) 254 may be formed at a single level, and word line(s) 252 may be formed at 2, 8, or 16 levels. In this case, sacrificial layer(s) 120 may be formed at 4, 10, or 18 levels, and first insulation layer(s) 110 may be formed at 5, 11, or 19 levels. However, a number of GSLs 256, SSLs 254, and word lines 252 is not limited herein.

Figure 3:
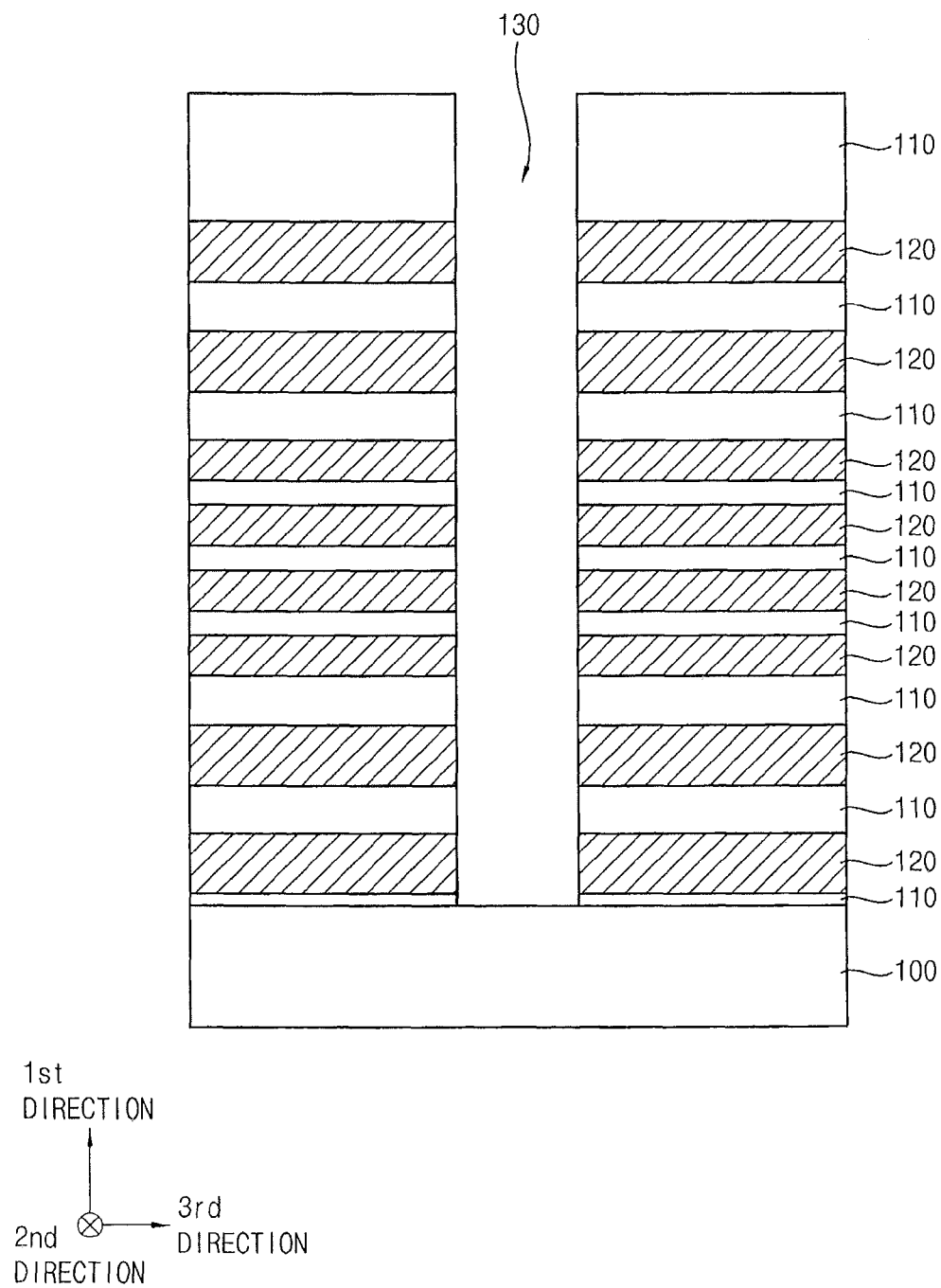

Referring to FIG. 3, a first opening(s) 130 may be formed through first insulation layer(s) 110 and sacrificial layer(s) 120 to expose a top surface of the substrate 100.

According to example embodiments, after forming a hard mask (not shown) on an uppermost first insulation layer 110, the first insulation layers 110 and the sacrificial layers 120 may be dry etched using the hard mask as an etch mask to form the first opening 130. The first opening 130 may extend in a first direction substantially perpendicular to the top surface of the substrate 100. Due to the characteristics of a dry etch process, the first opening 130 may be of a width that becomes gradually smaller from a top portion to a bottom portion thereof.

According to example embodiments, a plurality of first openings 130 may be formed in a second direction substantially parallel to the top surface of the substrate 100 to define a column of first openings, and a plurality of columns of first openings may be formed in a third direction substantially perpendicular to the second direction to define an array of first openings.

Figure 4:
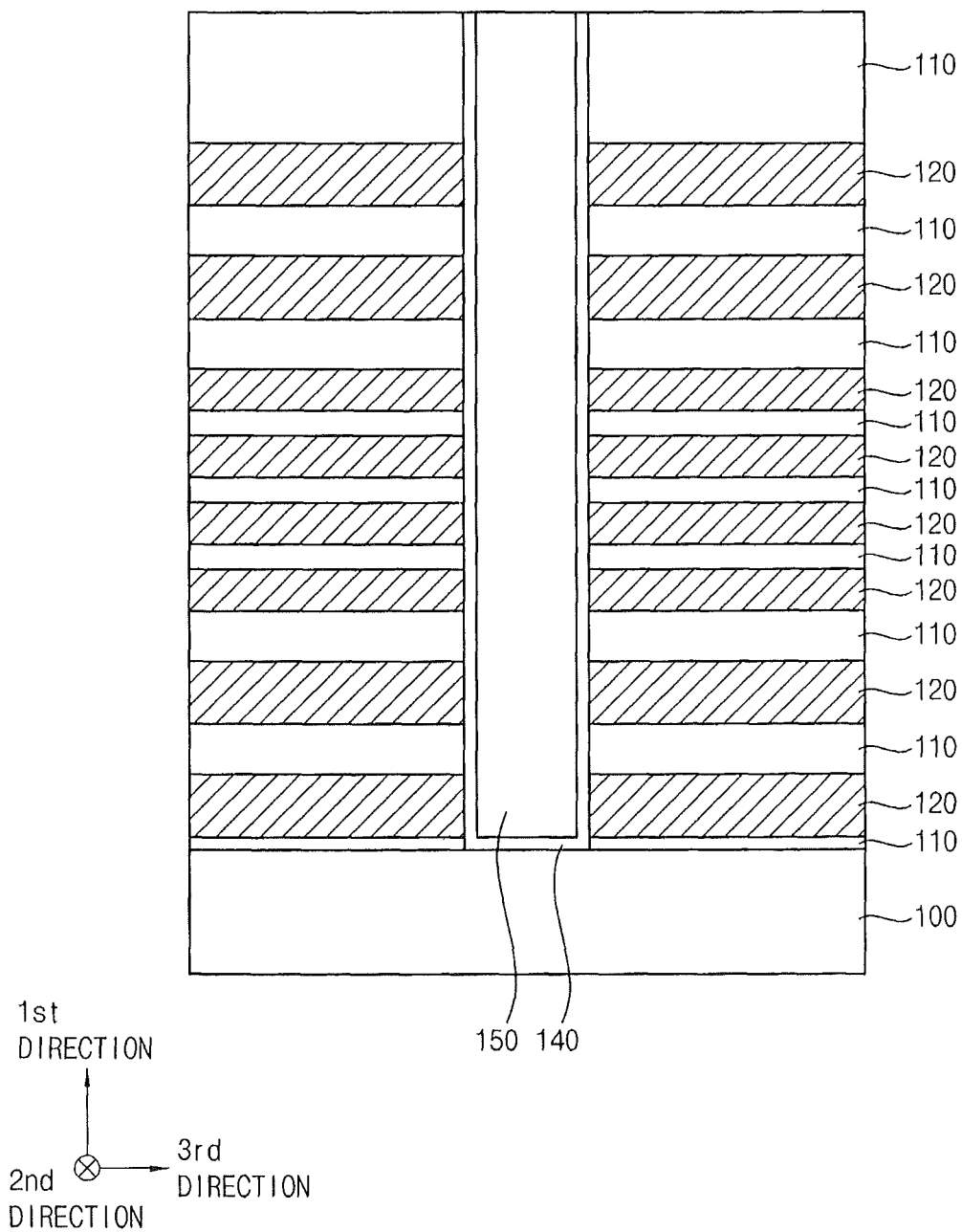

Referring to FIG. 4, a preliminary channel layer pattern(s) 140 may be formed on a sidewall of the first opening(s) 130 and on the exposed top surface of the substrate 100, and a filling layer pattern(s) 150 may be formed on the preliminary channel layer pattern(s) 140 to fill the remaining portion of the first opening(s) 130.

More particularly, a preliminary channel layer may be formed on the exposed top surface of the substrate 100, the sidewall(s) of the first opening(s) 130 and the first insulation layer(s) 110, and a filling layer may be formed on the preliminary channel layer to fill the remaining portion(s) of the first opening(s) 130. According to example embodiments, the preliminary channel layer may be formed to include, for example, doped polysilicon, single crystalline silicon and/or amorphous silicon. The filling layer may be formed to include, for example, an insulating material (e.g., an oxide).

Upper portions of the filling layer and the preliminary channel layer may be planarized until a top surface of the first insulation layer 110 is exposed to form the filling layer pattern(s) 150 and the preliminary channel layer pattern(s) 140, respectively, filling the first opening(s) 130. The preliminary channel layer pattern(s) 140 may be cup shaped and/or of a hollow cylindrical shape on the sidewall of the first opening (s) 130 and the exposed top surface of the substrate 100. According to example embodiments, a column of preliminary channel layer patterns and/or an array of channel layer patterns, which may correspond to the column of first openings and/or the array of first openings, may be formed. The planarization process may be performed, for example, using a chemical mechanical polishing (CMP) process and/or an etch back process.

Figure 5:
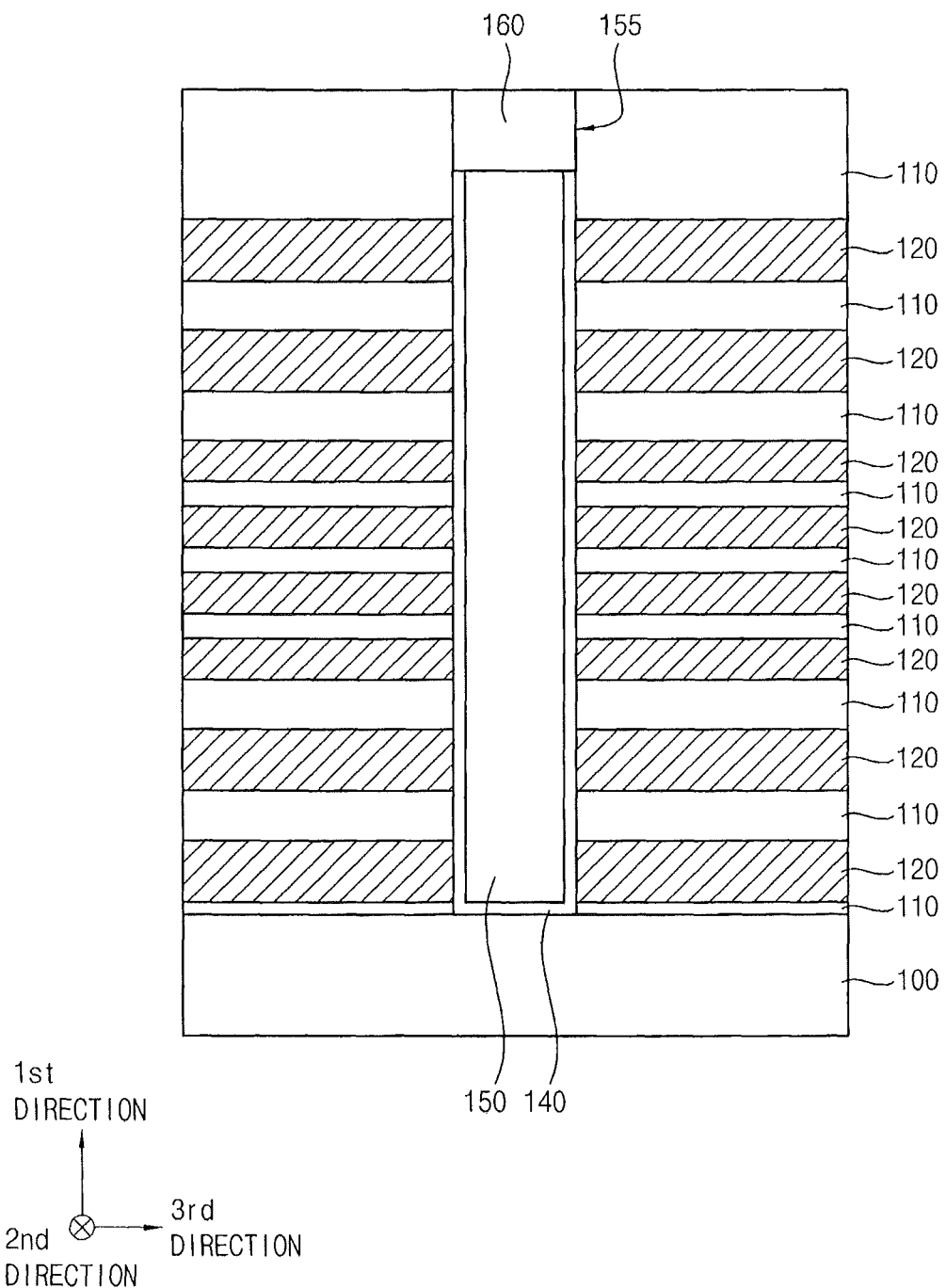

Referring to FIG. 5, upper portions of the filling layer pattern(s) 150 and the preliminary channel layer pattern(s) 140 may be removed to form a recess(es) 155, and a preliminary pad(s) 160 filling the recess(es) 155 may be formed.

More particularly, upper portions of the filling layer pattern(s) 150 and the preliminary channel layer pattern(s) 140 may be removed, for example, using an etch-back process to form the recess(es) 155. A preliminary pad layer filling the recess(es) 155 may be formed on the filling layer pattern 150, the preliminary channel layer pattern(s), 140 and the uppermost insulation layer 110, and an upper portion of the preliminary pad layer may be planarized until a top surface of the first insulation layer 110 is exposed to form the preliminary pad(s) 160. According to example embodiments, the preliminary pad layer may be formed to include polysilicon and/or amorphous silicon doped with carbon. Alternatively, the preliminary pad layer may be formed to include undoped polysilicon and/or undoped amorphous silicon. The planarization may be performed using a CMP process.

Figure 6:
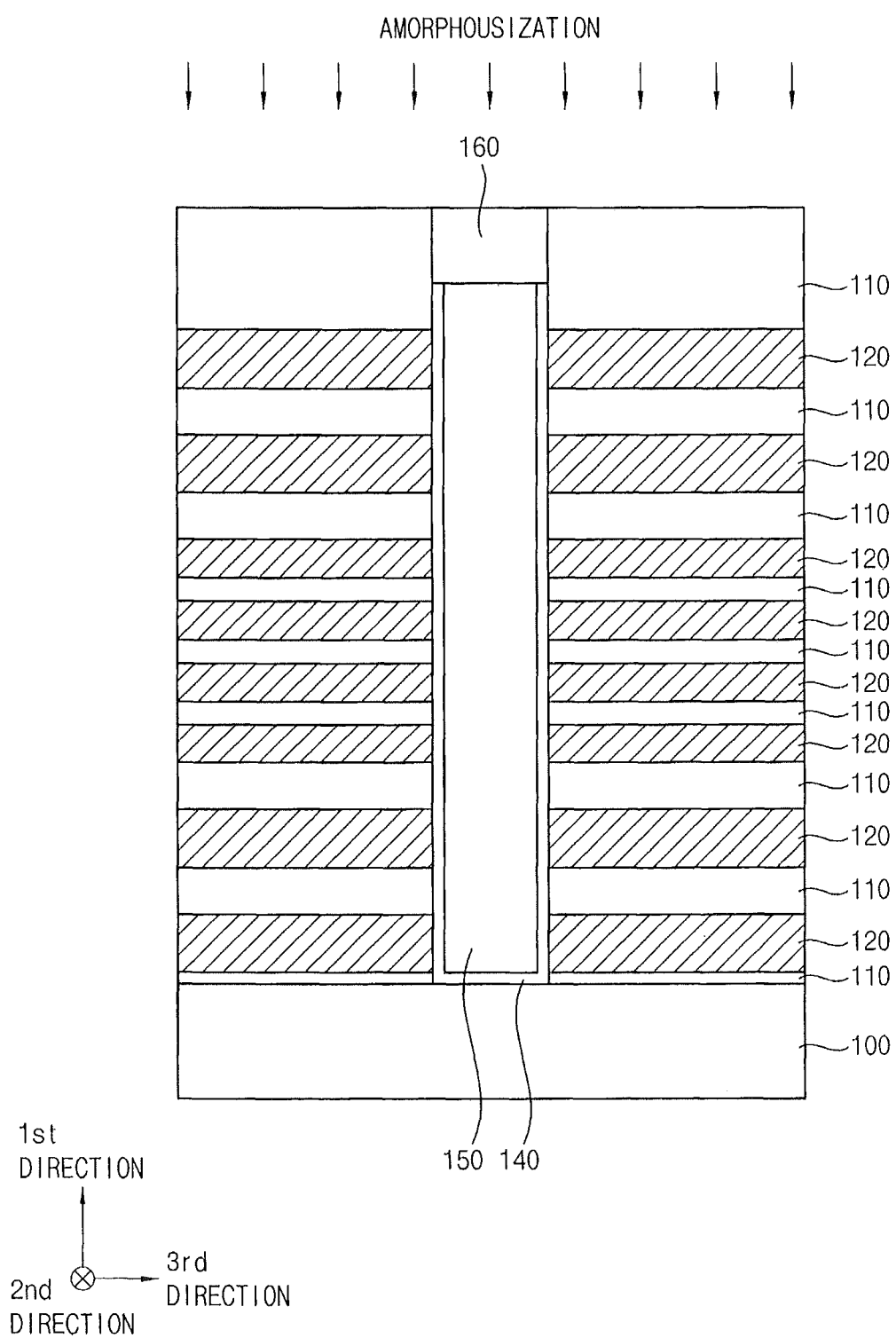

Referring to FIG. 6, ions may be implanted so that the preliminary channel layer pattern(s) 140 and/or the preliminary pad(s) 160 may be amorphousized (i.e., polysilicon may be converted to amorphous silicon). Stated in other words, the preliminary channel layer pattern(s), the preliminary pad(s), and/or portions thereof may be converted to an amorphous material (e.g. amorphous silicon).

That is, when the preliminary channel layer pattern(s) 140 and/or the preliminary pad(s) 160 include polysilicon, for example, silicon ions and/or germanium ions may be implanted therein, so that the preliminary channel layer pattern(s) 140 and/or the preliminary pad(s) 160 may be amorphousized. The amorphousization process, however, may be omitted.

Figure 7:
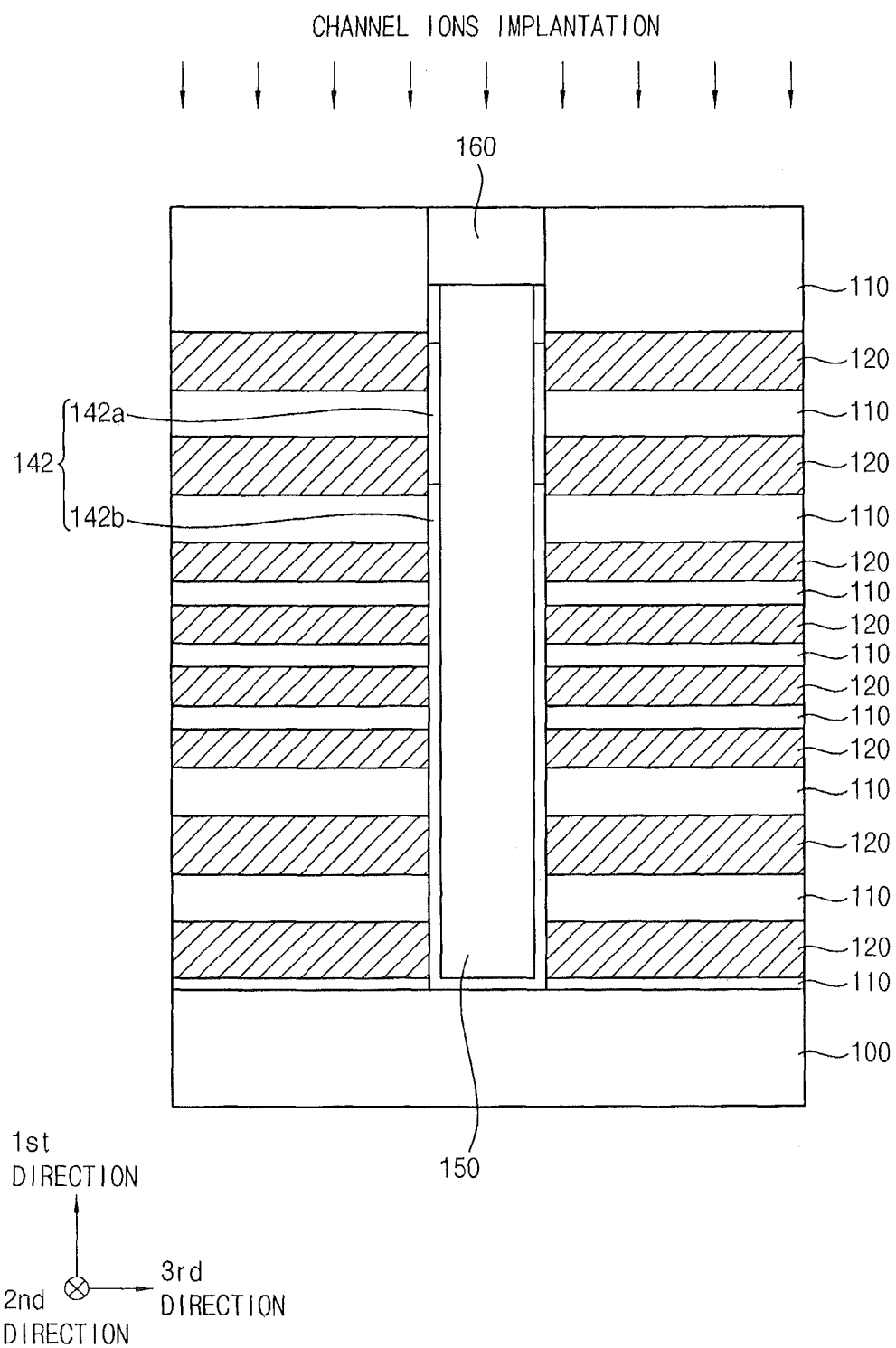

Referring to FIG. 7, channel ions may be implanted into the preliminary channel layer pattern(s) 140 to form a channel(s) 142. According to example embodiments, p-type impurities, e.g., indium and/or gallium may be implanted into a portion of the preliminary channel layer pattern(s) 140 to form a first channel layer 142a, and a portion of the preliminary channel layer pattern 140 that is not doped with p-type impurities may be referred to as a second channel layer 142b.

Indium and/or gallium may not diffuse as readily as boron, and thus the first channel layer(s) 142a may be doped with relative uniformity at a desired position. According to example embodiments, the first channel layer(s) 142a may be formed adjacent to a portion of the sacrificial layer(s) 120 at a level at which an SSL(s) 254 may be formed in a subsequent process. A depth of channel ion implant may thus define border between first and second channel layers 142a and 142b.

According to example embodiments, carbon may be further doped into the preliminary channel layer pattern(s) 140 together with the p-type impurities to form the first channel layer 142a. In this case, the diffusion of the p-type impurities may be further reduced.

Figure 8:
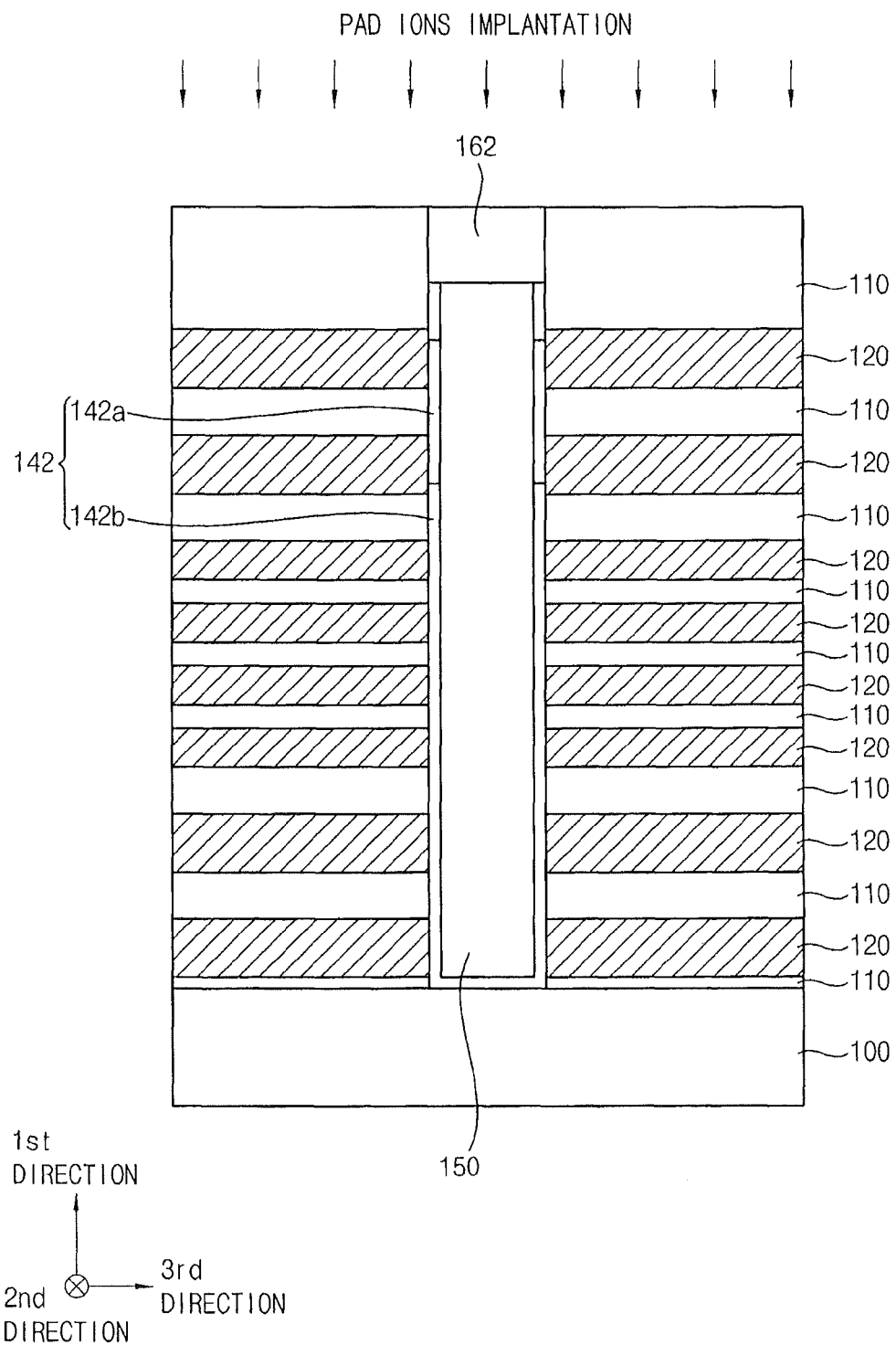

Referring to FIG. 8, pad ions may be implanted into the preliminary pad(s) 160, and a heat treatment may be performed on the preliminary pad(s) 160.

According to example embodiments, n-type impurities, e.g., phosphorous, arsenic, etc. may be doped into the preliminary pad(s) 160.

Arsenic may be well diffused when doped, and thus the pad 162 may have a relatively uniform doping profile. Particularly, the heat treatment may include a spike rapid thermal annealing (RTA) process or a laser annealing process for several milli seconds, so that the pad 162 may have a relatively uniform doping profile.

When phosphorous is doped, carbon has been already doped in the preliminary pad 160 so that the diffusion of phosphorous may be reduced or prevented during the doping process or the heat treatment. Thus, the pad(s) 162 may also have a relatively uniform doping profile.

Figure 9:
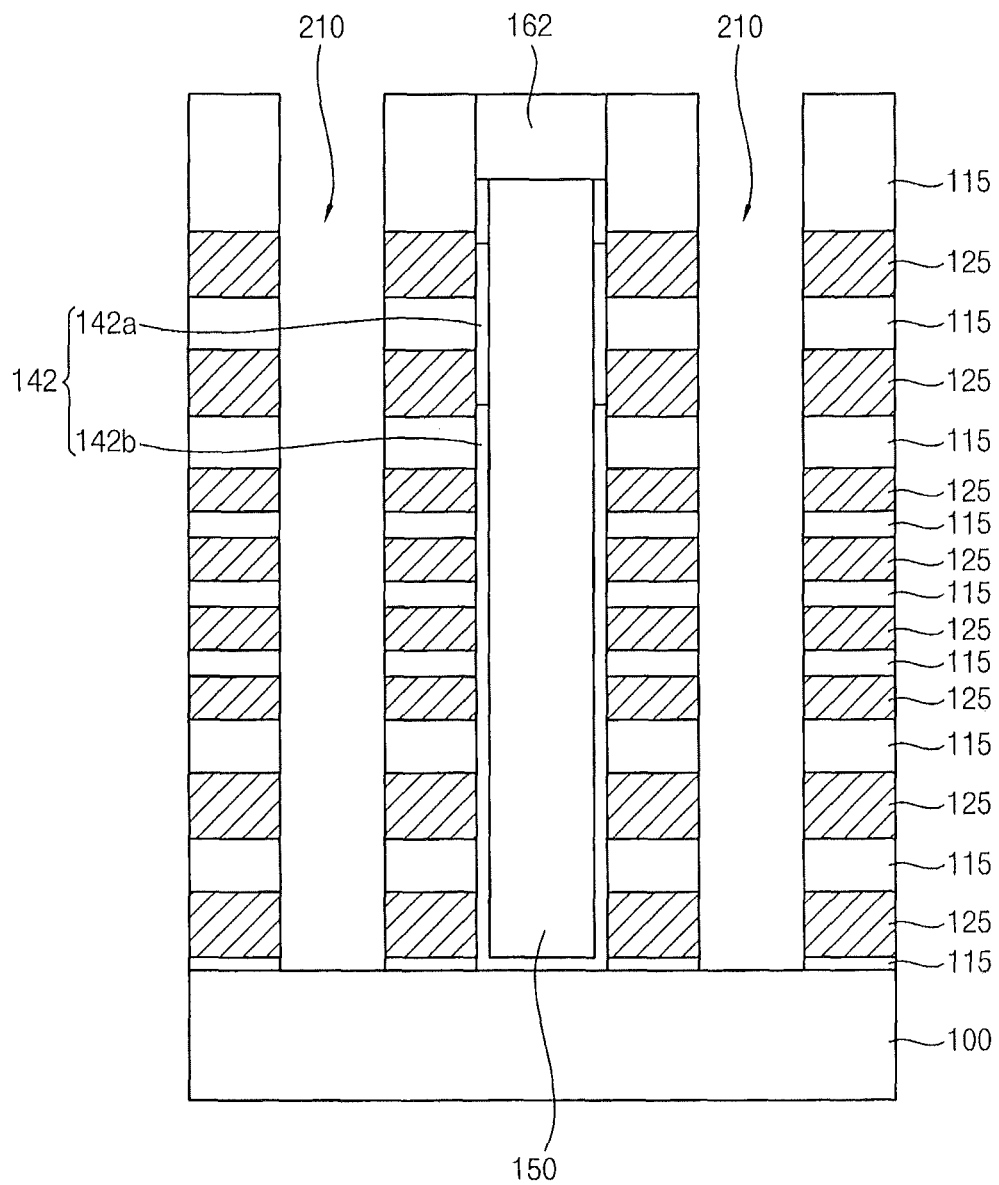

Referring to FIG. 9, second opening(s) 210 may be formed through the first insulation layers 110 and the sacrificial layers 120 to expose a top surface of the substrate 100.

According to example embodiments, after forming a hard mask (not shown) on the uppermost first insulation layer 110 and pad(s) 162, the insulation layers 110 and the sacrificial layers 120 may be, for example, dry etched using the hard mask as an etch mask to form the second opening(s) 210. The second opening(s) 210 may extend in the first direction.

According to example embodiments, a plurality of second openings 210 may be formed in the third direction, and each second opening 210 may extend in the second direction e.g., as a trench. Each of the first insulation layer(s) 110 and the sacrificial layer(s) 120 may be transformed into first insulation layer pattern(s) 115 and sacrificial layer pattern(s) 125, respectively. A plurality of first insulation layer patterns 115 and a plurality of sacrificial layer patterns 125 may be formed in the third direction at each level, and each first insulation layer pattern 115 and each sacrificial layer pattern 125 may extend in the second direction.

Figure 10:
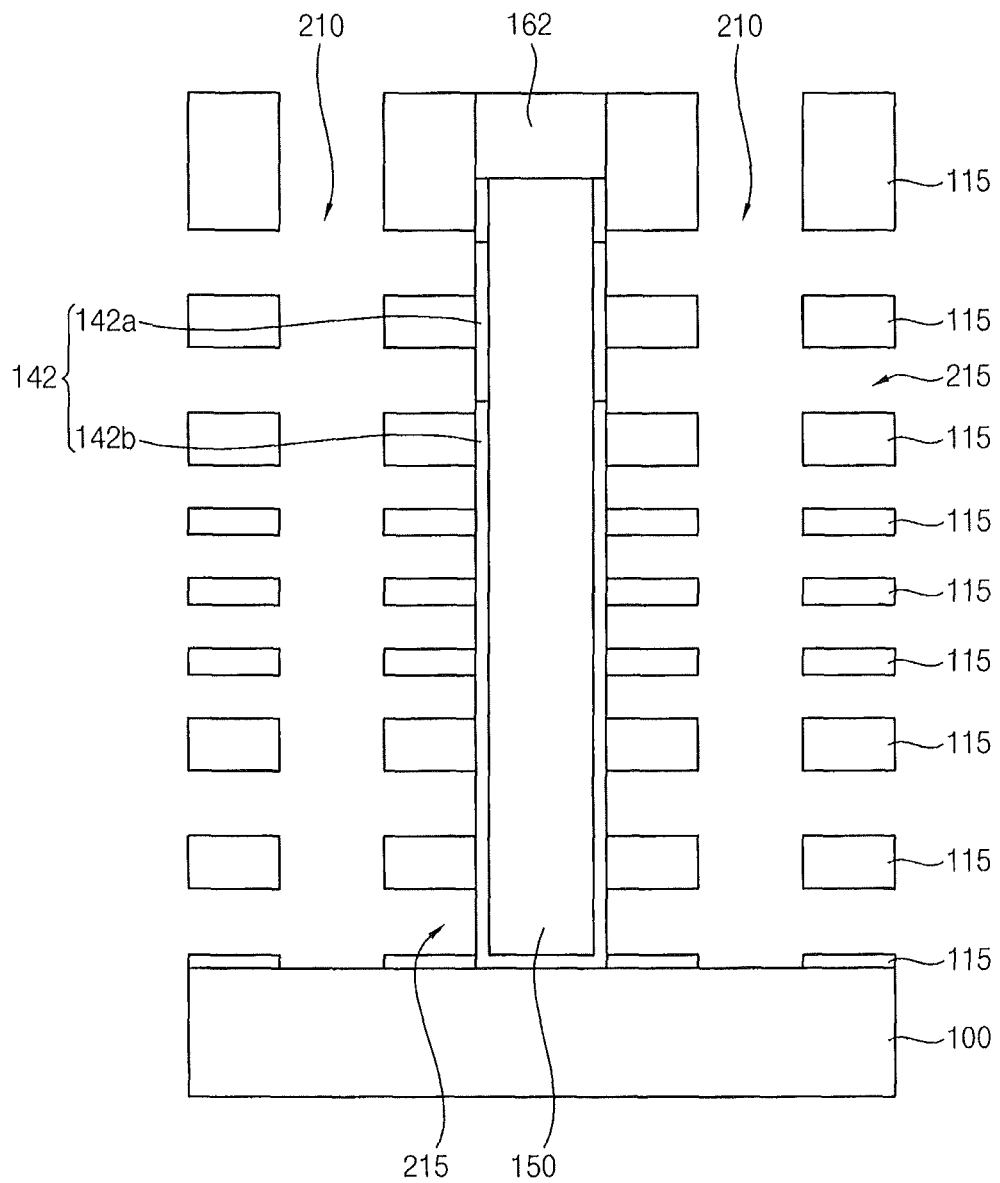

Referring to FIG. 10, the sacrificial layer patterns 125 may be removed to form a gap(s) 215 between the first insulation layer patterns 115 at adjacent levels. According to example embodiments, a plurality of gaps 215 may be formed between the first insulation layer patterns 115, respectively. An outer sidewall of the channel 142 may be exposed by the gap 215. According to example embodiments, the sacrificial layer patterns 125 exposed by the second opening 210 may be removed, for example, using a wet etch process using an etch solution including phosphoric acid and/or sulfuric acid.

Figure 11:
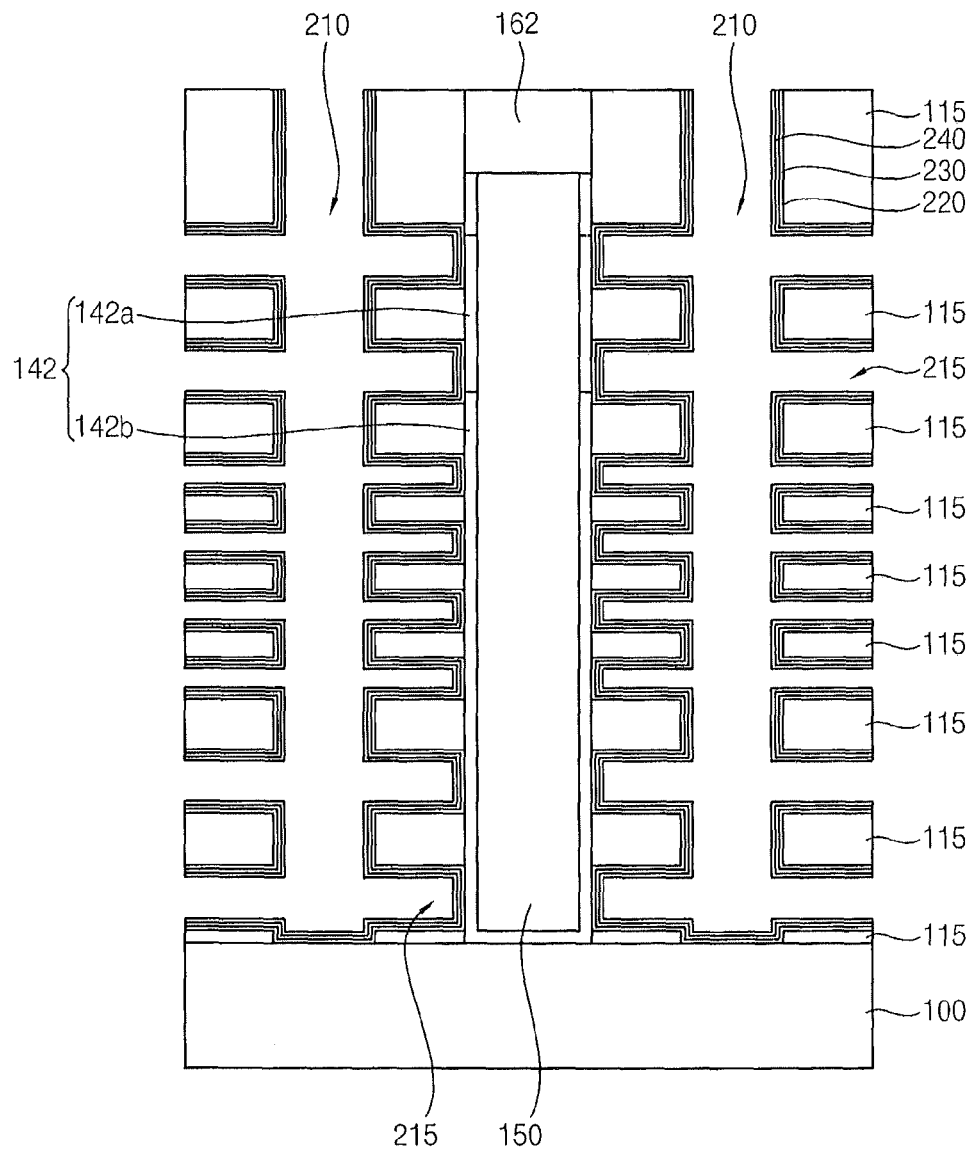

Referring to FIG. 11, a tunnel insulation layer(s) 220, a charge trapping layer(s) 230, and a blocking layer(s) 240 may be sequentially formed on the exposed outer sidewall of the channel(s) 142, an inner wall of the gap(s) 215, a surface of the first insulation layer pattern(s) 115, and the exposed top surface of the substrate 100.

According to example embodiments, the tunnel insulation layer(s) 220 may be, for example, formed as a silicon oxide layer using a CVD process. According to at least one example embodiment, the tunnel insulation layer(s) 220 may be formed using thermal oxidation on exposed portions of outer sidewall of the channel 142 in the gap 215. In this case, the tunnel insulation layer(s) 220 may not be formed on surface(s) of the first insulation layer pattern(s) 115.

The charge trapping layer(s) 230 may be formed to include a nitride, (for example, a silicon nitride) and/or a metal oxide. The blocking layer(s) 240 may be formed to include, for example, a silicon oxide and/or a metal oxide. For example, the metal oxide may include aluminum oxide, hafnium oxide, lanthanum oxide, lanthanum aluminum oxide, lanthanum hafnium oxide, hafnium aluminum oxide, titanium oxide, tantalum oxide, and/or zirconium oxide. According to at least one example embodiment, the blocking layer(s) 240 may be formed to be a multi-layered structure including a silicon oxide layer and a metal oxide layer.

Referring to FIG. 12, a gate electrode layer 250 may be formed on the blocking layer(s) 240 to fill the gap(s) 215.

According to example embodiments, the gate electrode layer 250 may be formed to include a metal and/or a metal nitride. For example, the gate electrode layer 250 may be formed to include a metal and/or a metal nitride with a low electrical resistance (for example, tungsten, tungsten nitride, titanium, titanium nitride, tantalum, tantalum nitride, and/or platinum). According to at least one example embodiment, the gate electrode layer(s) 250 may be formed as a multilayered structure including a metal nitride barrier layer and a metal layer.

The gate electrode layer 250 may be formed, for example, using CVD and/or ALD, and the second opening 210 may be partially filled.

Figure 13:
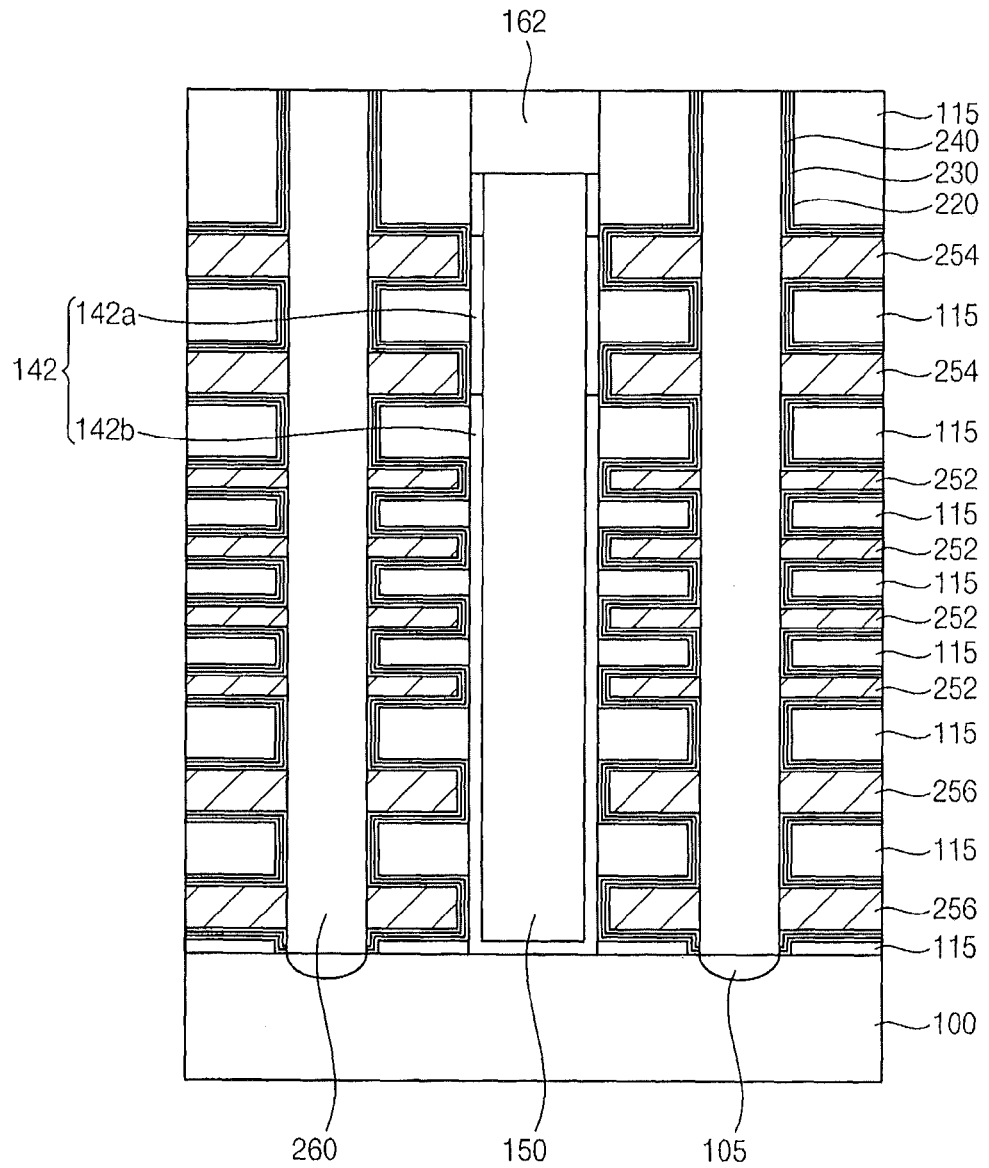

Referring to FIG. 13, the gate electrode layer 250 may be partially removed to form the GSL(s) 256, the word line(s) 252, and the SSL(s) 254 in the gaps 215. According to example embodiments, the gate electrode layer 250 may be partially removed, for example, using a wet etch.

Each of the GSL(s) 256, the word line(s) 252, and the SSL(s) 254 may be formed at a single level or at a plurality of levels. According to at least one example embodiment, each of the GSL(s) 256 and the SSL(s) 254 may be formed at 2 levels, and the word line(s) 252 may be formed at 4 levels between the GSL(s) 256 and the SSL(s) 254. However, numbers of GSLs 256, word lines 252, and SSLs 254 are not limited to this example.

When the gate electrode layer 250 is partially removed, portions of the blocking layer(s) 240, the charge trapping layer(s) 230 and the tunnel insulation layer(s) 220 on top surfaces of the first insulation layer pattern 115, the substrate 100, and the pad 162 may also be removed to form a blocking layer pattern(s) 245, a charge trapping layer pattern(s) 235, and a tunnel insulation layer pattern(s) 225, respectively. According to at least one example embodiment, portions of the blocking layer(s) 240, the charge trapping layer(s) 230, and the tunnel insulation layer(s) 220 on a sidewall(s) of the first insulation layer pattern(s) 115 may be also removed so that the blocking layer pattern(s) 245, the charge trapping layer pattern(s) 235, and the tunnel insulation layer pattern(s) 225 may be formed only on the inner wall(s) of the gap(s) 215.

In a process in which the gate electrode layer(s) 250, the blocking layer(s) 240, the charge trapping layer(s) 230, and the tunnel insulation layer(s) 220 are partially removed, a third opening (not shown) exposing a top surface of the substrate 100 and extending in the second direction may be formed, and impurities may be implanted into the exposed top surface of the substrate 100 to form an impurity region(s) 105. According to example embodiments, the impurities may include n-type impurities, for example, phosphorus and/or arsenic. According to example embodiments, the impurity region(s) 105 may extend in the second direction and serve as a CSL(s).

A metal silicide pattern (not shown), e.g., a cobalt silicide pattern may be further formed on the impurity region 105.

A second insulation layer pattern(s) 260 filling the third opening may be formed. According to example embodiments, after a second insulation layer filling the third opening is formed on the substrate 100 and the first insulation layer pattern(s) 115, the second insulation layer may be planarized until a top surface of the first insulation layer pattern(s) 115 is exposed to form the second insulation layer pattern(s) 260.

Figure 14:
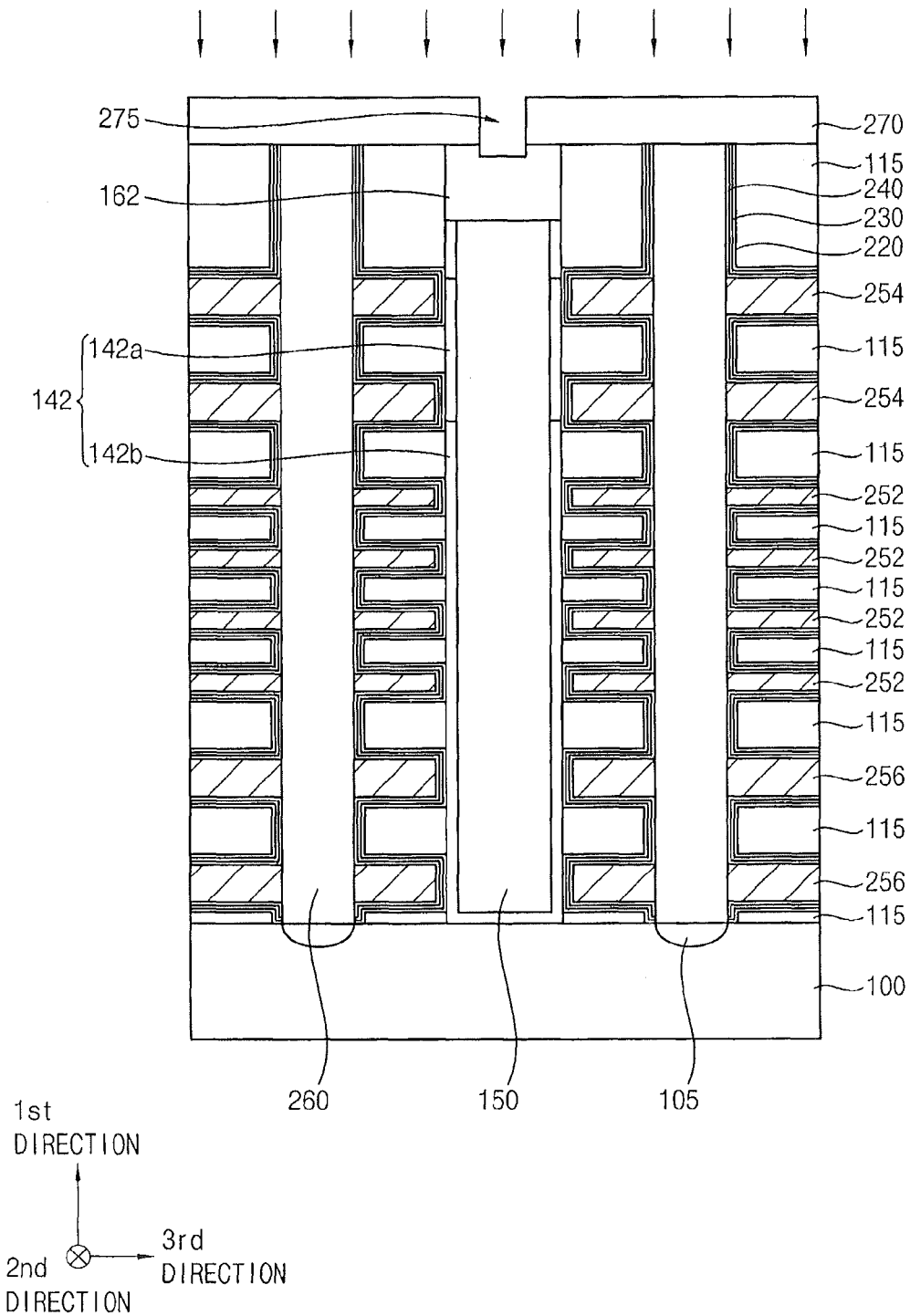

Referring to FIG. 14, a third insulation layer 270 may be formed on the first and second insulation layer patterns 115 and 260, the pad(s) 162, the blocking layer pattern(s) 245, the charge trapping layer pattern(s) 235 and the tunnel insulation layer pattern(s) 225, and a fourth opening(s) 275 may be formed to expose a top surface of the pad(s) 162. According to example embodiments, a plurality of fourth openings 275 corresponding to the channels 142 and the pads 162 may be formed in the second direction to form a column of fourth openings, and a plurality of columns of fourth opening(s) may be formed in the third direction to form an array of fourth openings.

Pad ions may be further implanted into exposed portions of pad(s) 162 using the third insulation layer 270 as an ion implantation mask. According to example embodiments, n-type impurities, e.g., phosphorus and/or arsenic may be implanted.

Referring again to FIGS. 1A, 1B, and 1C, bit line contact(s) 280 may be formed on pad(s) 162 to fill the fourth opening(s). Bit line contact(s) 280 may be formed to include, for example, a metal, a metal nitride, and/or doped polysilicon.

Bit line(s) 290 (electrically connected to the bit line contact(s) 280) may be formed to complete the vertical memory device. Bit line(s) 290 may be formed to include, for example, a metal, a metal nitride, and/or doped polysilicon. According to example embodiments, bit line(s) 290 may be formed to extend in the third direction.

According to example embodiments, the channel(s) 142 and the pad(s) 162 may be formed using impurities having relatively low diffusion characteristics, so that diffusion of impurities may be prevented or reduced during the subsequent heat treatments. Thus, the pad(s) 162 and/or the channel(s) 142 may have relatively uniform doping profiles.

That is, indium or gallium (having relatively low diffusion characteristics) may be doped into the preliminary channel layer pattern(s) 140 adjacent to the SSL(s) 254, so that the channel(s) 142 having a relatively uniform doping profile may be formed. In this case, carbon may also be doped so that the diffusion may be further reduced. Thus, the vertical memory device may have a relatively small threshold voltage distribution. Additionally, the preliminary pad(s) 160 (already doped with carbon) may be doped with phosphorous or arsenic to form the pad(s) 162 having a relatively uniform doping profile. Particularly, after doping phosphorous or arsenic, a rapid thermal anneal (RTA) may be used instead of a long heat treatment at a low temperature so that the relatively uniform doping profile may be maintained. Accordingly, the vertical memory device may have a relatively small source/drain resistance distribution.

According to example embodiments, impurities may be doped before forming the word line(s) 252 or the third insulation layer(s) 270, and thus the thickness of the first insulation layer pattern(s) 115 stacked on the preliminary channel layer pattern(s) 140 or the area of the exposed top surface of the preliminary pad(s) 160 may be relatively uniform, so that the channel(s) 142 and the pad(s) 162 may have a relatively uniform doping profile.

Figure 15:
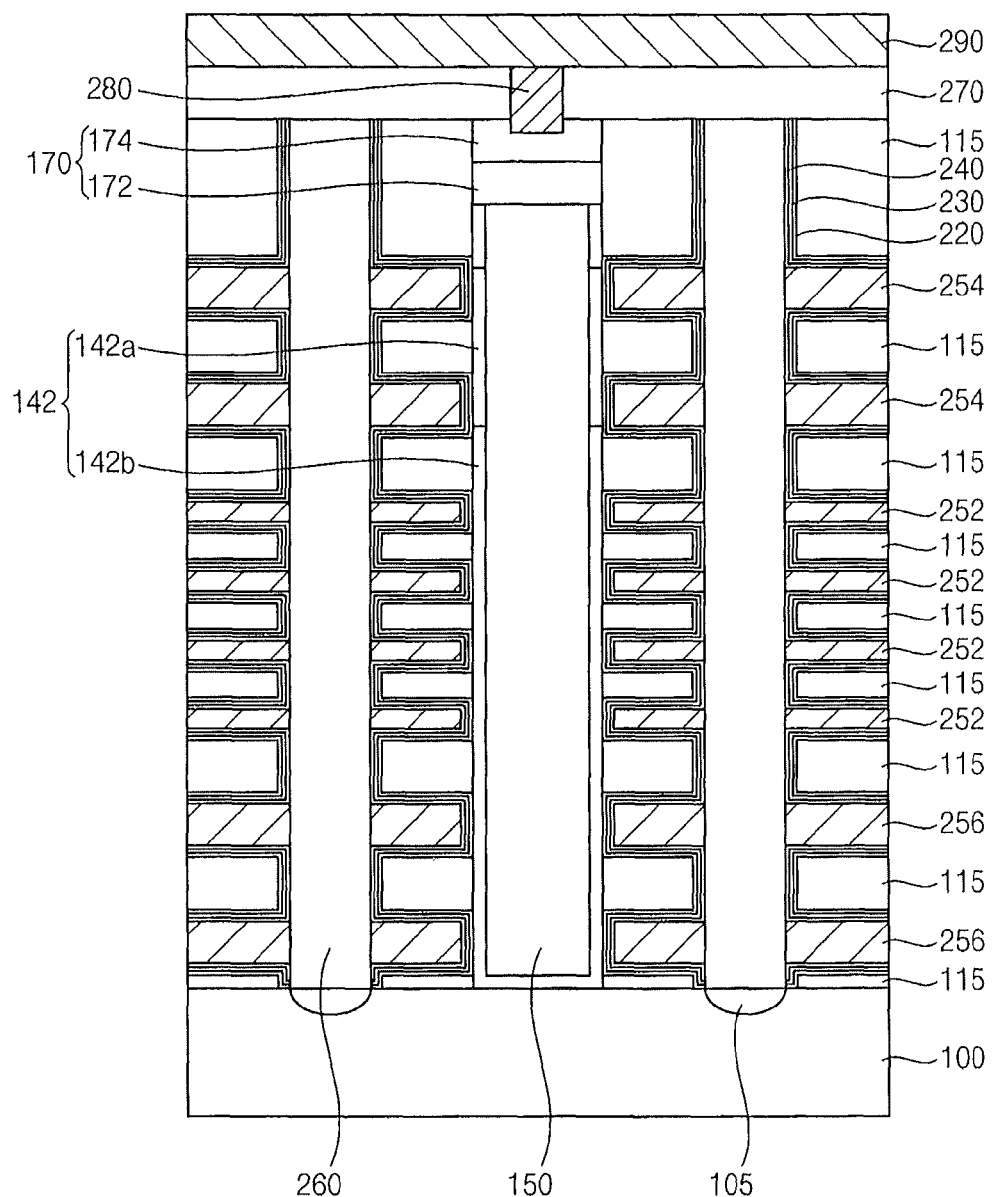

FIG. 15 is a cross-sectional diagram illustrating vertical memory devices in accordance with other example embodiments. The vertical memory device of FIG. 15 may be substantially the same as or similar to that of FIGS. 1A, 1B, and 1C except for the pad(s), and thus repetitive explanations thereof may be omitted.

Referring to FIG. 15, the pad(s) 170 may include first pad layer(s) 172 including polysilicon doped with carbon and phosphorus or doped with carbon and arsenic, and second pad layer 174 including polysilicon doped with phosphorous or arsenic.

The vertical memory device may be formed as follows.

When performing operations discussed with reference to FIGS. 3, 4, and 5, a carbon source gas and a silicon source gas may be provided for a certain time onto an inner wall of the first opening(s) 130 and a top surface of the first insulation layer 110, and only the silicon source gas may be provided to form a preliminary channel layer, and an upper portion of the preliminary channel layer may be planarized until the top surface of the first insulation layer 110 is exposed. Thus, a polysilicon layer doped with carbon and an undoped polysilicon layer may be formed in the first opening(s) 130. Phosphorous or arsenic may be further doped to form the first and second pad layers 172 and 174.

The polysilicon layer doped with carbon may be formed so that diffusion may be reduced or prevented when doping phosphorous or arsenic or when performing a heat treatment. Thus, the pad(s) 170 may have a relatively uniform doping profile.

Figure 16B:
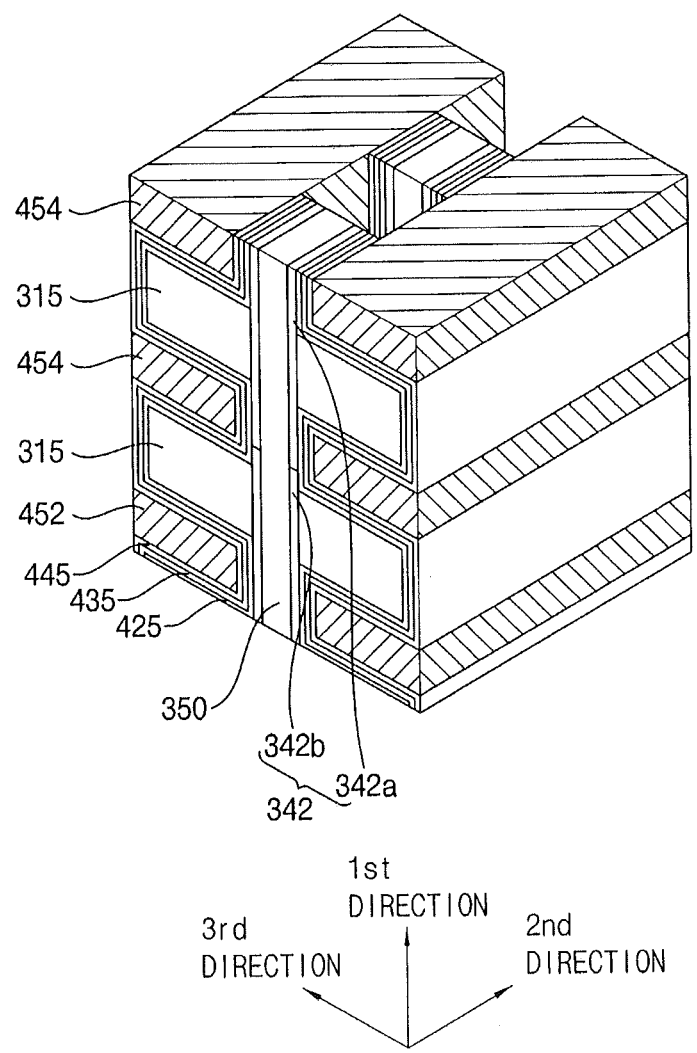

FIGS. 16A and 16B are a perspective diagram and a local perspective diagram, respectively, illustrating vertical memory devices in accordance with other example embodiments. FIG. 16B may be a local perspective view of region B of the vertical memory device in FIG. 16A. The vertical memory device may be substantially the same as that of FIG. 1, except that the vertical memory device of FIGS. 16A and 16B may include an insulation layer pattern(s), and the shapes of a filling layer pattern(s) and a pad(s) may be different from those of the filling layer pattern(s) and the pad(s) of FIGS. 1A, 1B, and 1C, and thus repetitive explanations may be omitted herein.

Referring to FIGS. 16A and 16B, a vertical memory device may include a channel(s) 342 extending in a first direction substantially perpendicular to a top surface of a substrate 300, and a GSL(s) 456, a word line(s) 452 and an SSL(s) 454 on a first sidewall of the channel(s) 342 along the first direction. The vertical memory device may include a bit line(s) 490 electrically connected to the channel(s) 342, and impurity region(s) 305 (see impurity regions(s) 105 of FIG. 23) serving as a CSL(s). Bit line(s) 490 may be electrically connected to channel(s) 342 via pad(s) 362 and bit line contact(s) 480.

According to example embodiments, a plurality of channels 342 may extend in a second direction substantially parallel to the top surface of the substrate 300 to define a column of channel(s), and a plurality of columns of channels may be provided in a third direction substantially perpendicular to the second direction to define an array of channels.

According to example embodiments, the channel(s) 342 may be of a linear and/or bar shape extending in the first direction. Channel(s) 342 may include first channel layer(s) 342*a* adjacent to SSL(s) 454, and second channel layer(s) 342*b* that is not adjacent to SSL(s) 454. According to example embodiments, first channel layer(s) 342*a* may include polysilicon doped with p-type impurities, e.g., indium and/or gallium, and may further include carbon and/or germanium.

Filling layer pattern(s) 350 of a pillar shape may be in a space between channels 342 with the linear shape adjacent to each other in the third direction, and more particularly, between second sidewalls of channels 342 on which GSL(s) 456, word line(s) 452, and SSL(s) 454 are not included. Filling layer pattern(s) 350 may include an insulating material, for example, an oxide.

Pad(s) 362 may be on filling layer pattern(s) 350 and channel(s) 342, and may electrically connect channel(s) 342 to bit line contact(s) 480. Pad(s) 362 may include polysilicon doped with phosphorous or arsenic. When pad(s) 362 includes polysilicon doped with phosphorous, pad(s) 362 may further include carbon.

A plurality of structures (each of which may include two channels 342, filling layer pattern 350, and pad 362) may be insulated from each other by third insulation layer pattern(s) 465 (see FIG. 25) in the second direction. Third insulation layer pattern(s) 465 may be of a pillar shape extending in the first direction. According to example embodiments, a plurality of third insulation layer patterns may be in the second direction to define a column of third insulation layer patterns, and a plurality of columns of third insulation layer patterns may be formed in the third direction to define an array of third insulation layer patterns.

Tunnel insulation layer pattern(s) 425, charge trapping layer pattern(s) 435, and blocking layer pattern(s) 445 may be between each of GSL(s) 456, word line(s) 452, and SSL(s) 454, and the first sidewall of channel(s) 342 in the third direction. Tunnel insulation layer pattern(s) 425, charge trapping layer pattern(s) 435, and blocking layer pattern(s) 445 may be between each of GSL(s) 456, word line(s) 452, and SSL(s) 454, and first insulation layer pattern(s) 315 and/or on a sidewall of first insulation layer pattern(s) 315. According to at least one example embodiment, tunnel insulation layer pattern(s) 425 may be only on the first sidewall of channel(s) 342.

Second insulation layer pattern(s) 460 (see FIG. 23) may be formed between structures each of which may include GSL(s) 456, word line(s) 452, and SSL(s) 454 extending in the second direction and first insulation layer pattern(s) 315 therebetween. Impurity region(s) 305 (refer to FIG. 23) may be at an upper portion of substrate 300 beneath second insulation layer pattern(s) 460, which may extend in the second direction and serve as a CSL(s).

Bit line(s) 490 may be electrically connected to pad(s) 362 via bit line contact(s) 480, and may be electrically connected to channel(s) 342. According to example embodiments, bit line(s) 490 may extend in the third direction. Bit line contact(s) 480 may extend through a fourth insulation layer(s) 470 (refer to FIG. 26), and contact pad(s) 362. Fourth insulation layer 470 may be formed on first, second and third insulation layer patterns 315, 460 and 465, channel(s) 342, pad(s) 362, blocking layer pattern(s) 445, charge trapping layer pattern(s) 435, and tunnel insulation layer pattern(s) 425.

FIGS. 17-28 are perspective diagrams illustrating methods of manufacturing a vertical memory device of FIG. 16 in accordance with example embodiments. The method may include operations substantially the same as or similar to those of FIGS. 1A, 1B, 1C and 2-14, and thus detailed explanations may be omitted herein.

Referring to FIG. 17, operations substantially the same as or similar to those illustrated with reference to FIGS. 2 and 3 may be performed. First insulation layers and sacrificial layers may be alternately and repeatedly formed on substrate 300, and first opening(s) 330 extending in a first direction substantially perpendicular to a top surface of substrate 300 may be formed through the first insulation and sacrificial layers to expose a top surface of substrate 300.

First opening(s) 330 may not be of an island shape but may extend in a second direction substantially parallel to the top surface of substrate 300. According to example embodiments, a plurality of first openings 330 may be formed as trenches in a third direction substantially perpendicular to the second direction. The first insulation and sacrificial layers may be transformed into first insulation layer patterns 315 and sacrificial layer patterns 325. Each first insulation layer pattern 315 and each sacrificial layer pattern 325 in each level may extend in the second direction. According to example embodiments, a plurality of first insulation layer patterns 315 and a plurality of sacrificial layer patterns 325 may be formed in the third direction at each level (e.g., each level or height may include one of first insulation layer patterns 315 and sacrificial layer patterns 325).

Referring to FIG. 18, an operation substantially the same as or similar to that illustrated with reference to FIG. 4 may be performed. Preliminary channel layer pattern(s) 340 may be formed on an inner wall of first opening(s) 330 and the exposed top surface of substrate 300, and filling layer pattern(s) 350 filling the remaining portion of first opening(s) 330 may be formed. According to example embodiments, preliminary channel layer pattern(s) 340 may be formed to include polysilicon and/or amorphous silicon.

Referring to FIG. 19, an operation substantially the same as or similar to that illustrated with reference to FIG. 5 may be performed. Preliminary pad(s) 360 may be formed to include polysilicon or amorphous silicon doped with carbon. Alternatively, preliminary pad(s) 360 may be formed to include undoped polysilicon and/or undoped amorphous silicon.

Referring to FIG. 20, operations substantially the same as or similar to those illustrated with reference to FIGS. 6 to 8 may be performed.

Silicon ions and/or germanium ions may be implanted so that preliminary channel layer pattern(s) 340 and/or preliminary pad(s) 360 may be amorphousized. Channel ions, (e.g., indium and/or gallium) may be implanted into the preliminary channel layer pattern(s) 340 to form a channel 342a. According to example embodiments, carbon may be further doped into the preliminary channel layer pattern(s) 340. Thus, first channel layer(s) 342a adjacent to sacrificial layer pattern(s) 325 at a level at which an SSL(s) 454 may be formed, and a second channel layer 342b may be formed. Pad ions, (e.g., phosphorous and/or arsenic) may be implanted into preliminary pad(s) 360, and a heat treatment may be performed on preliminary pad(s) 360 to form pad(s) 362 having a relatively uniform doping profile.

Referring to FIG. 21, an operation substantially the same as or similar to that illustrated with reference to FIG. 9 may be performed.

Second opening(s) 410 may be formed as a trench(es) through first insulation layer pattern(s) 315 and sacrificial layer pattern(s) 325 to expose a top surface of substrate 300. According to example embodiments, a plurality of second openings 410 may be formed in the third direction, and each second opening 410 may extend as a trench in the second direction.

Referring to FIG. 22, an operation substantially the same as or similar to that illustrated with reference to FIG. 10 may be performed. Sacrificial layer pattern(s) 325 may be removed to form gap(s) 415 between first insulation layer patterns 315 at a plurality of levels.

Figure 23:
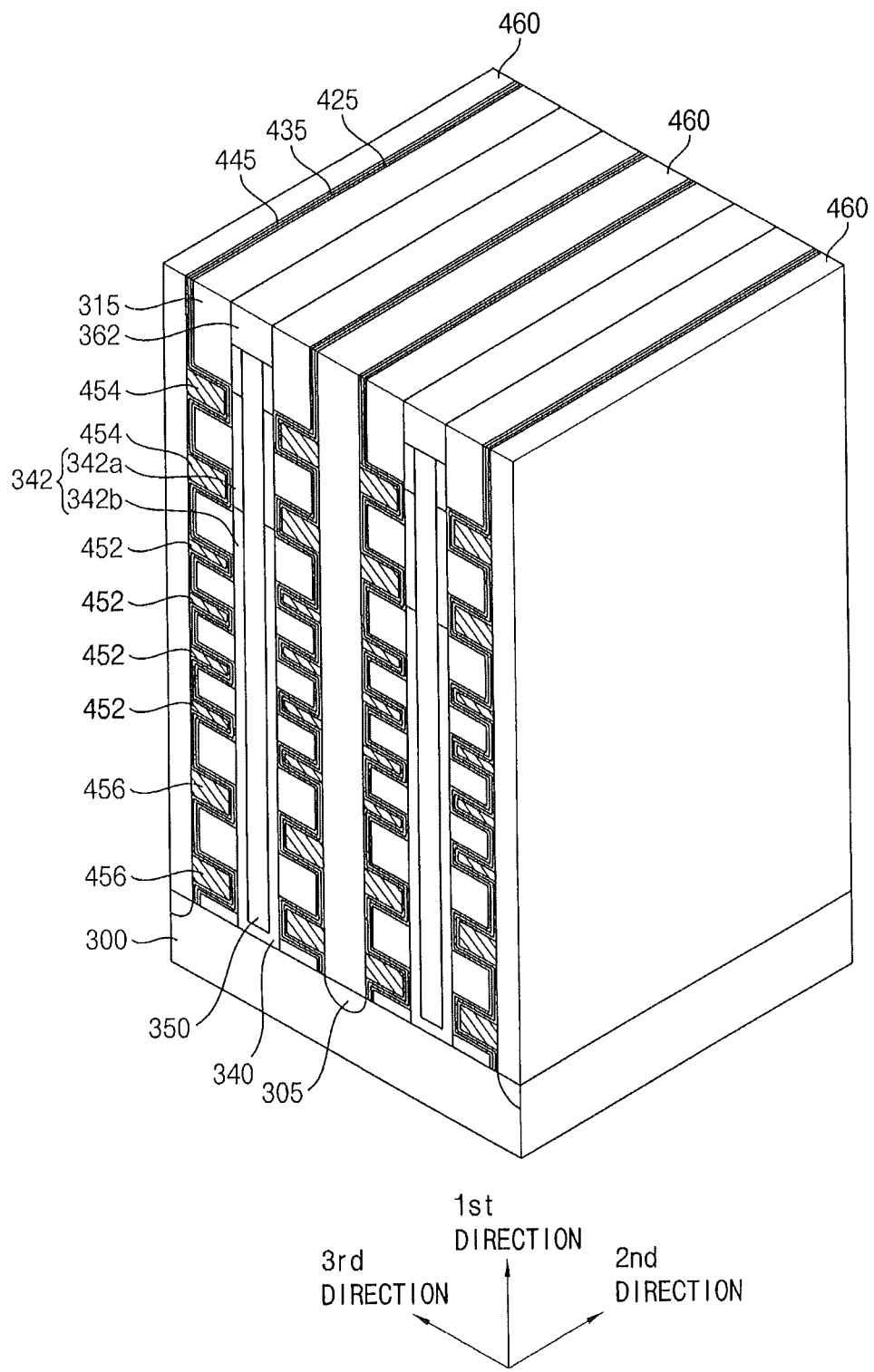

Referring to FIG. 23, operations substantially the same as or similar to those illustrated with reference to FIGS. 11-13 may be performed.

Tunnel insulation layer pattern(s) 425, charge trapping layer pattern(s) 435, and blocking layer pattern(s) 445 may be sequentially formed on an inner wall of gap(s) 415 and a sidewall of first insulation layer pattern(s) 315, and GSL(s) 456, word line(s) 452, and SSL(s) 454 may be formed at a remaining portion of gap(s) 415.

Impurity region(s) 305 serving as a CSL(s) may be formed at an upper portion of the substrate 300 exposed by a third opening (not shown) extending in the second direction between a plurality of structures (each of which may include GSL(s) 456, word line(s) 452, SSL(s) 454 and first insulation layer pattern(s) 315), and second insulation layer pattern(s) 460 filling the third opening(s) and extending in the second direction may be formed. According to example embodiments, a plurality of second insulation layer patterns 460 may be formed in the third direction.

Figure 24:
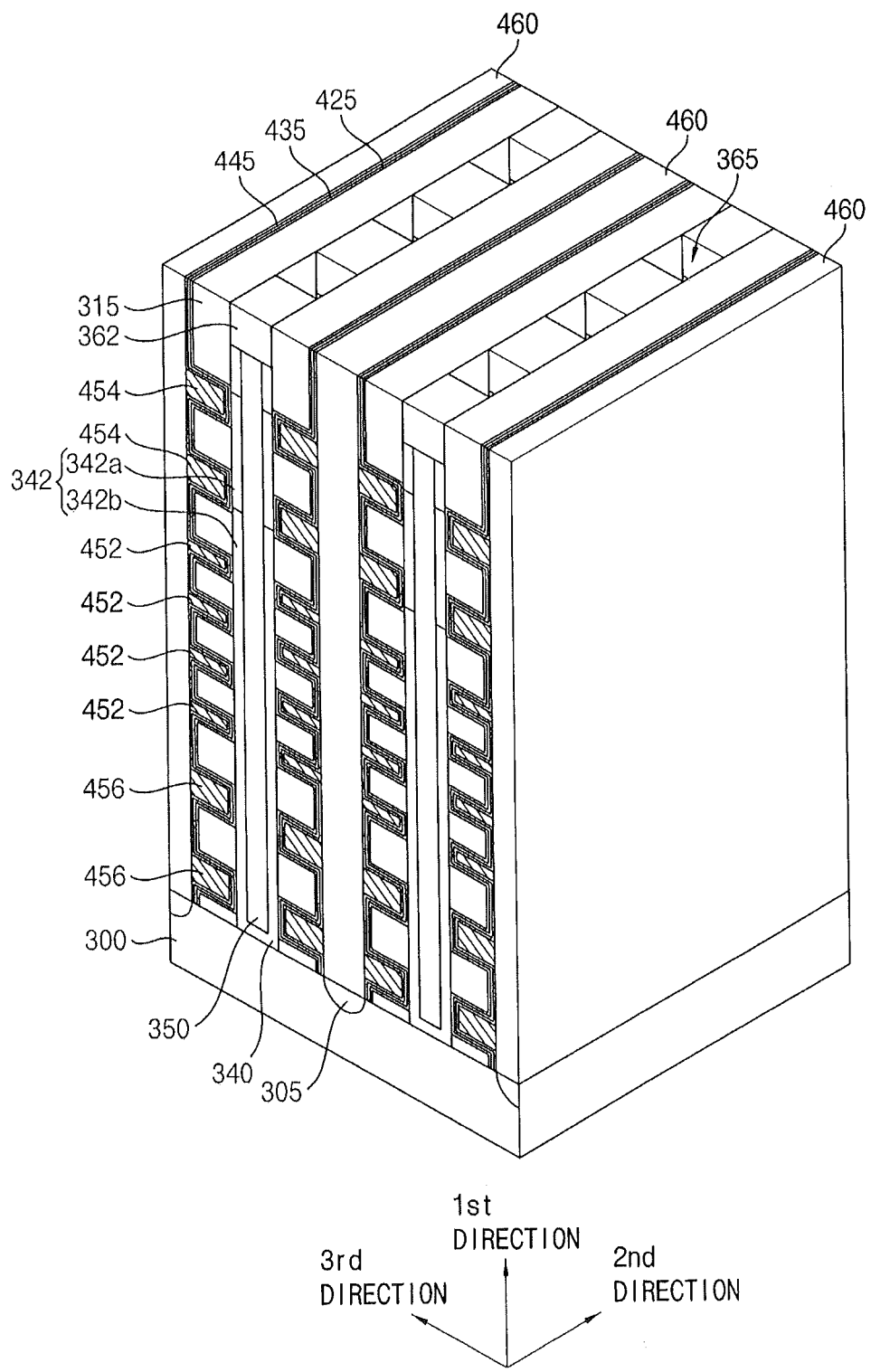

Referring to FIG. 24, pad(s) 362, channel(s) 342, and filling layer pattern(s) 350 may be partially removed to form fourth opening(s) 365 exposing a top surface of substrate 300 and extending in the first direction. According to example embodiments, a plurality of fourth openings 365 of an island shape may be formed in the second direction to define a column of fourth openings, and a plurality of columns of fourth openings may be formed in the third direction to define an array of fourth openings.

Figure 25:
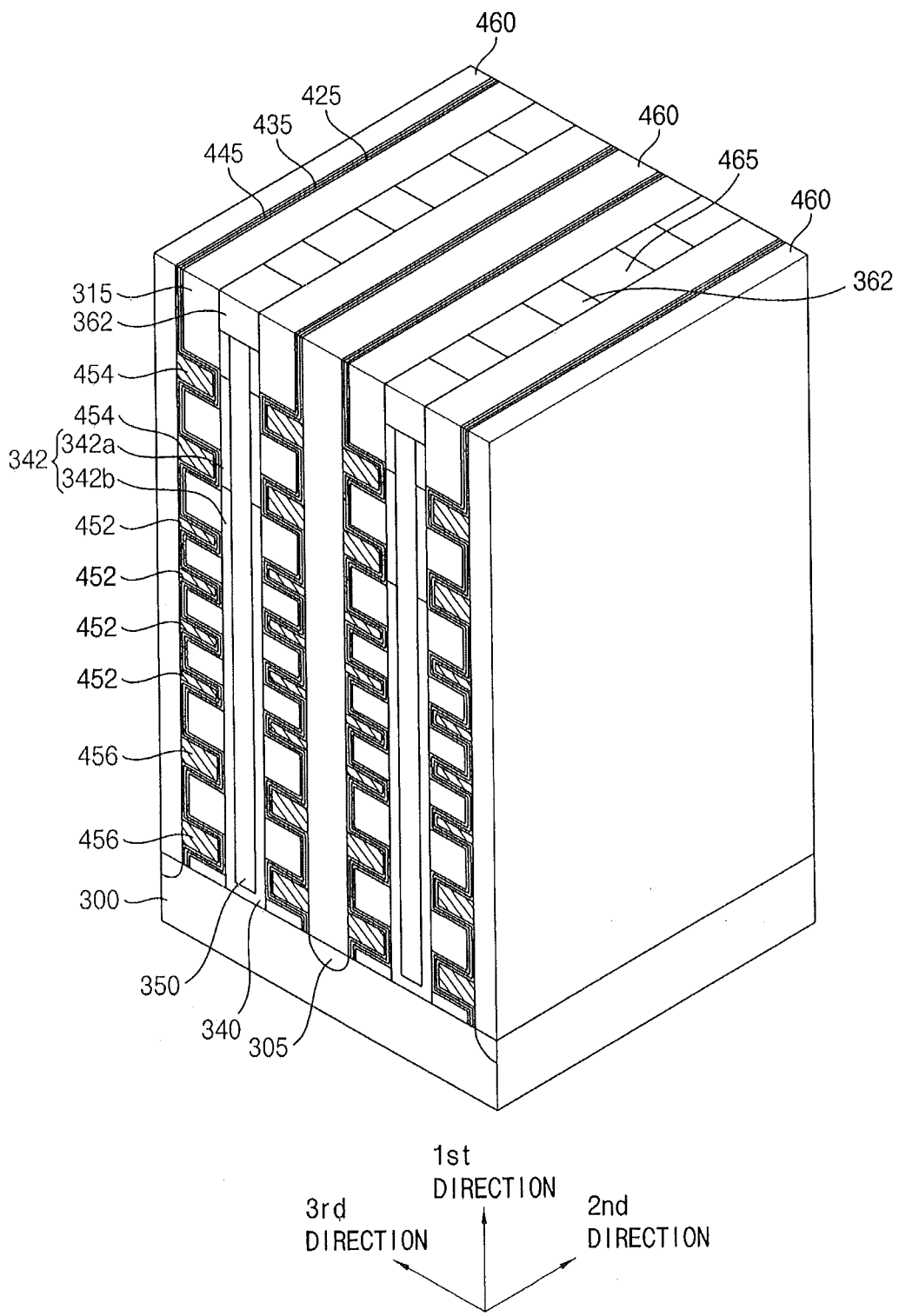

Referring to FIG. 25, third insulation layer pattern(s) 465 may be formed in fourth opening(s) 365. A third insulation layer filling fourth opening(s) 365 may be formed on substrate 300, first and second insulation layer patterns 315 and 460, pad(s) 362, blocking layer pattern(s) 445, charge trapping layer pattern(s) 435, and tunnel insulation layer pattern (s) 425. The third insulation layer pattern may be planarized until a top surface of first insulation layer pattern(s) 315 is exposed to form third insulation layer pattern(s) 465. According to example embodiments, the third insulation layer may be formed to include an insulating material, for example, an oxide.

Figure 26:
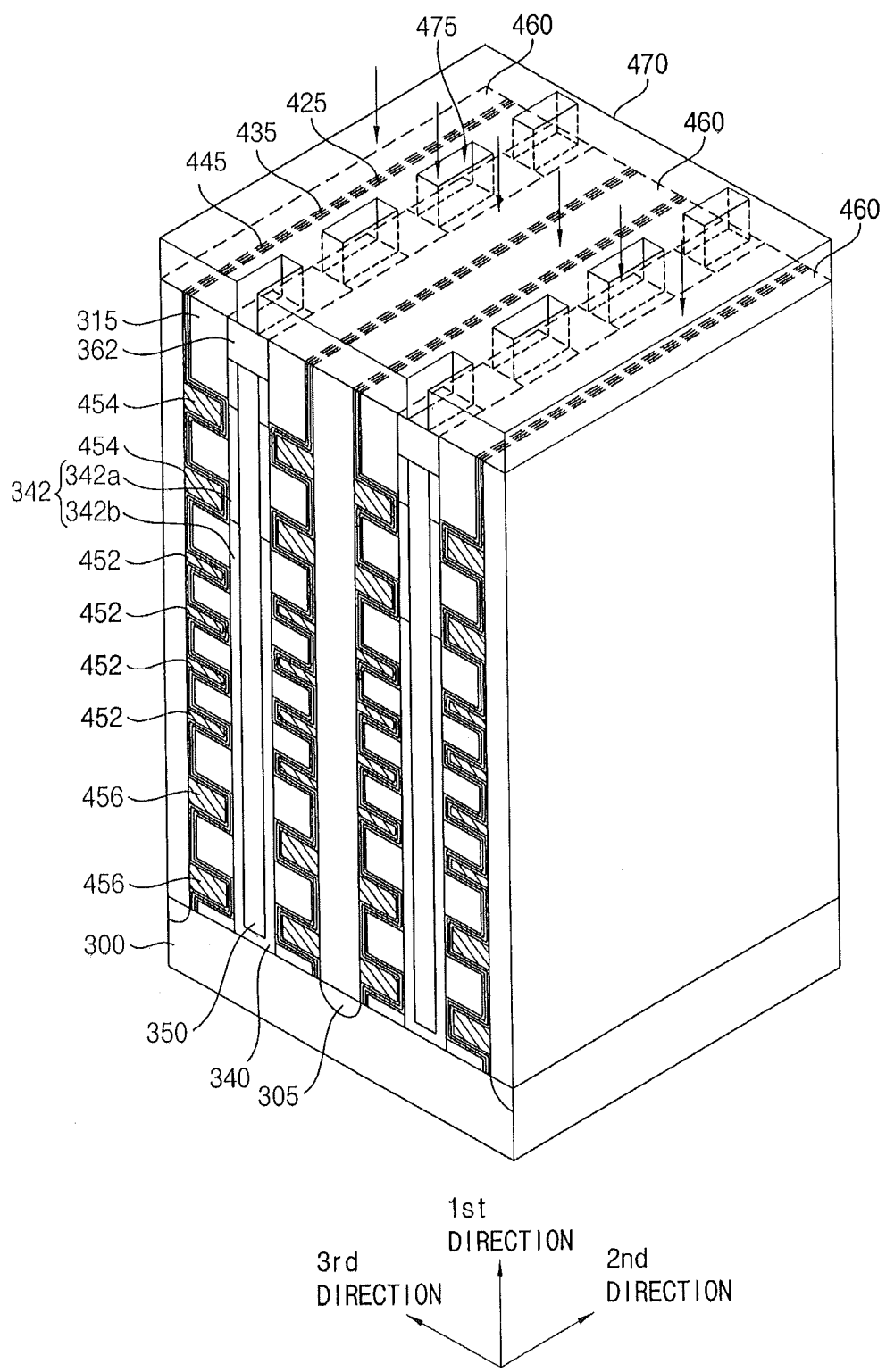

Referring to FIG. 26, an operation substantially the same as or similar to that illustrated with reference to FIG. 14 may be performed.

Fourth insulation layer 470 may be formed on first to third insulation layer patterns 315, 460 and 465, pad(s) 362, blocking layer pattern(s) 445, charge trapping layer pattern(s) 435, and tunnel insulation layer pattern(s) 425, and fifth opening (s) 475 may be formed to expose a top surface of pad(s) 362. According to example embodiments, a plurality of fifth openings may be formed in the second direction to define a column of fifth openings, and a plurality of columns of fifth openings may be formed in the third direction to define an array of fifth openings.

Pad ions (e.g., phosphorous and/or arsenic) may be further implanted into pad(s) 362 using fourth insulation layer 470 as an ion implantation mask.

Figure 27:
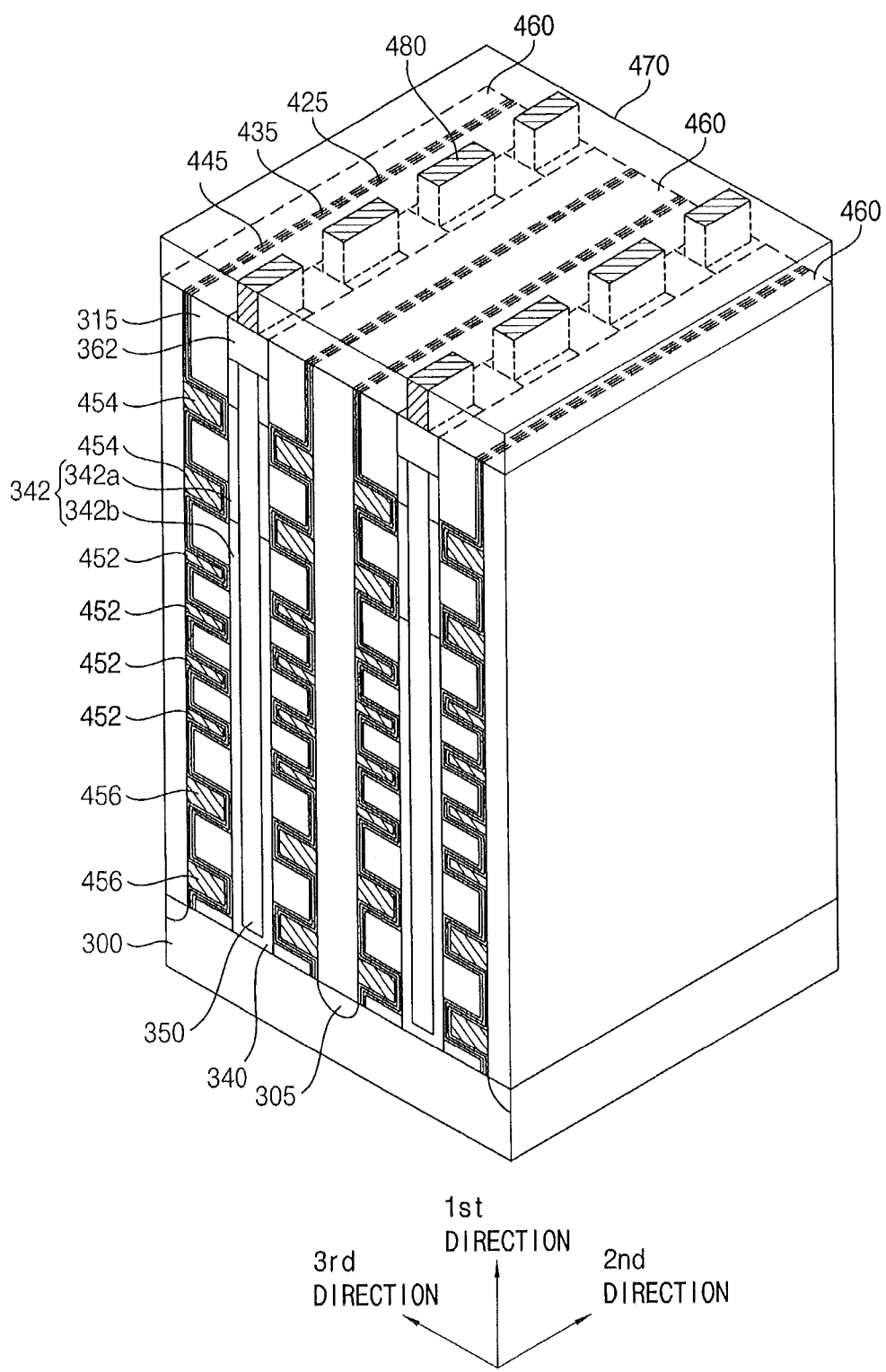

Referring to FIG. 27, bit line contact(s) 480 may be formed on exposed portions of pad(s) 362 to fill fifth opening(s) 475. Bit line contact(s) 480 may be formed to include, for example, a metal, a metal nitride, and/or doped polysilicon. According to example embodiments, a column of bit line contacts and an array of bit line contacts corresponding to the column of fifth openings and the array of fifth openings, respectively, may be formed.

Figure 28:
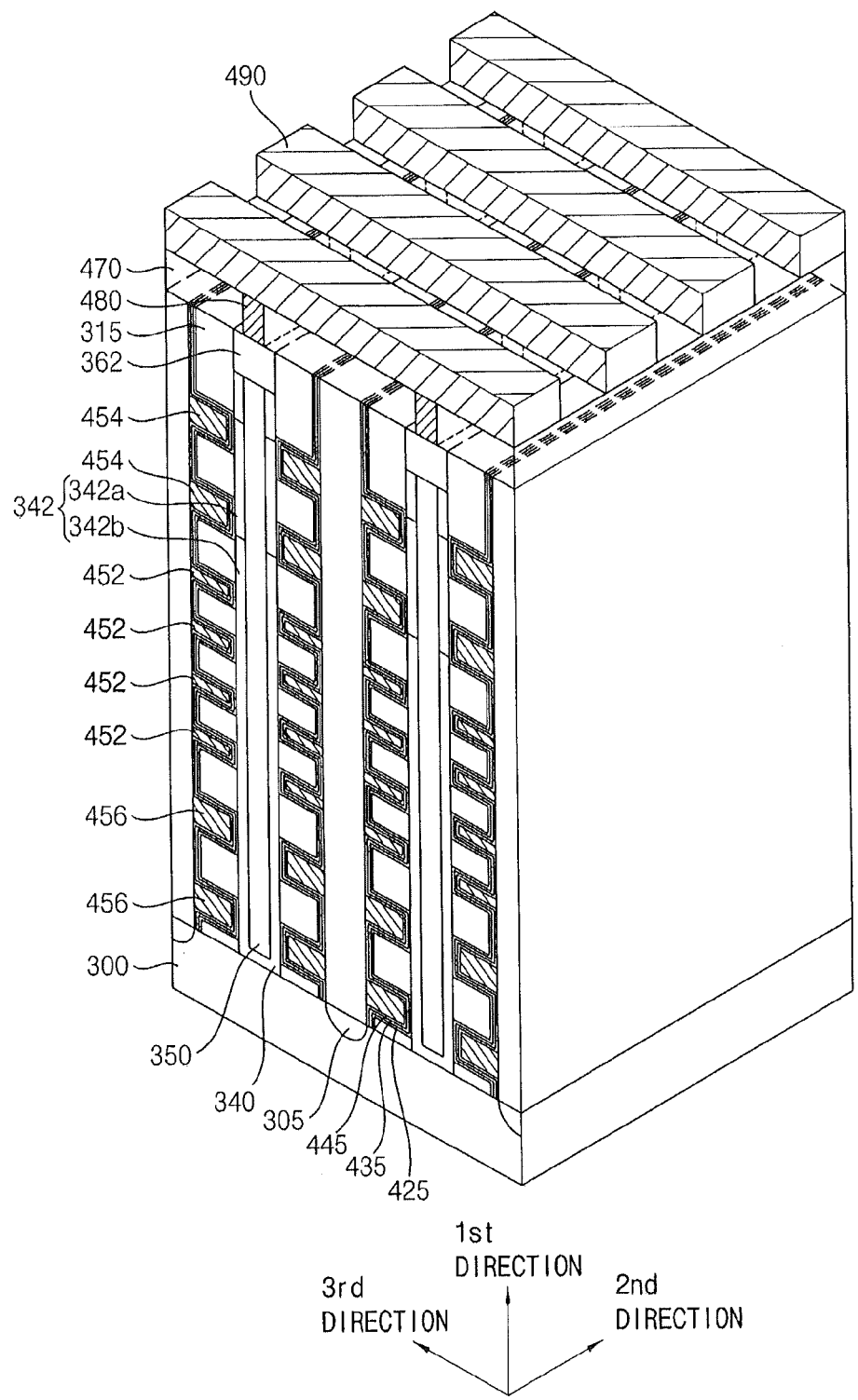

Referring to FIG. 28, bit line(s) 490 electrically connected to bit line contact(s) 480 may be formed to complete the vertical memory device. Bit line(s) 490 may be formed to include, for example, a metal, a metal nitride, and/or doped polysilicon. According to example embodiments, bit line(s) 490 may be formed to extend in the third direction.

Figure 29:
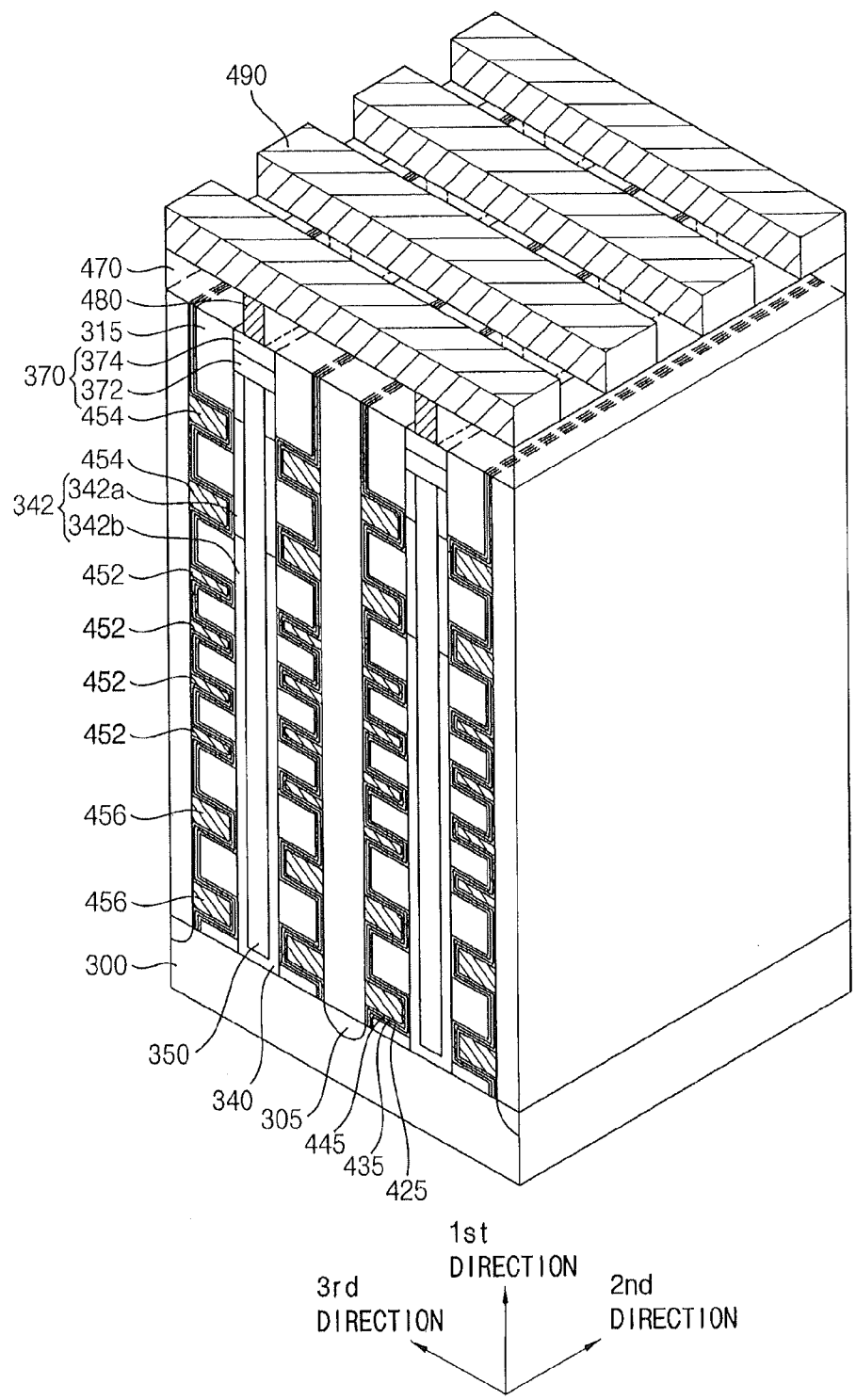

FIG. 29 is a perspective diagram illustrating vertical memory devices in accordance with still other example embodiments. The vertical memory device of FIG. 29 may be substantially the same as or similar to that of FIG. 16 except for a pad. Thus, repetitive explanations thereof may be omitted.

Referring to FIG. 29, pad(s) 370 may have first pad layer(s) 372 including polysilicon doped with carbon and phosphorous or doped with carbon and arsenic, and second pad layer (s) 374 including polysilicon doped with phosphorous and/or arsenic.

As discussed above with respect to FIGS. 1C, 13-15, and 23-29, common source lines (CSLs) may be provided as impurity regions 105/305 in substrate 100/300 adjacent insulation layer patterns 260/460. According to some other embodiments, however, common source lines (CSLs) may be provided as impurity regions in substrate 100/300 adjacent (and electrically coupled to) channels 142/342 so that each channel 142/342 is electrically coupled between a respective CSL and a bit line 290/490. For example, CSL impurity regions may be implanted into exposed portions of substrate 100 through openings 130/330 (in FIGS. 3 and 17) before forming preliminary channel layer patterns 140/340 (in FIGS. 4 and 18). According to other embodiments, CSL impurity regions may be selectively implanted into substrate 100/300 before forming sacrificial layers 120/325 and/or insulation layers 110/315. A plurality of such common source lines and bit lines may thus be provided with the common source lines being provided in a direction that is orthogonal with respect to a direction of the bit lines.

While example embodiments have been particularly shown and described, it will be understood by one of ordinary skill in the art that variations in form and detail may be made therein without departing from the spirit and scope of the claims.

That which is claimed is:

1. A vertical memory device comprising:
    a substrate;
    a first selection line on the substrate;
    a plurality of word lines on the first selection line, wherein the first selection line is between the plurality of word lines and the substrate;
    a second selection line on the plurality of word lines, wherein the plurality of word lines is between the first and second selection lines, and wherein the first and second selection lines and the plurality of word lines are spaced apart in a direction perpendicular with respect to a surface of the substrate; and
    a semiconductor channel extending away from the surface of the substrate adjacent sidewalls of the first and second selection lines and the plurality of word lines, wherein portions of the semiconductor channel adjacent the second selection line are doped with indium and/or gallium.

2. The vertical memory device of claim 1 wherein the first selection line comprises at least one ground selection line, wherein the second selection line comprises at least one string selection line, and wherein the semiconductor channel comprises a silicon channel.

3. The vertical memory device of claim 2 wherein the silicon channel comprises polysilicon.

4. The vertical memory device of claim 2 wherein the portions of the silicon channel adjacent the second selection line are further doped with carbon.

5. The vertical memory device of claim 1 further comprising:
    a silicon pad on the semiconductor channel, wherein the silicon pad is doped with carbon and phosphorous, and wherein the semiconductor channel is between the silicon pad and the substrate.

6. The vertical memory device of claim 1 wherein the silicon pad comprises a first silicon pad, the vertical memory device further comprising:
    a second silicon pad on the first silicon pad, wherein the second silicon pad is doped with phosphorous, wherein a concentration of carbon in the second silicon pad is less than a concentration of carbon in the first silicon pad, and wherein the first silicon pad is between the second silicon pad and the semiconductor channel.

7. The vertical memory device of claim 1 further comprising:
    a silicon pad on the semiconductor channel, wherein the silicon pad is doped with arsenic, and wherein the semiconductor channel is between the silicon pad and the substrate.

8. The vertical memory device of claim 1 wherein the semiconductor channel is substantially conical and/or cylindrical.

9. The vertical memory device of claim 1 wherein the semiconductor channel has a substantially planar surface adjacent the sidewalls of the first and second selection lines and the plurality of word lines.

10. The vertical memory device of claim 1 further comprising:
    a common source line extending along a surface of the substrate; and
    a bit line on the semiconductor channel, wherein the semiconductor channel is between the bit line and the substrate, and wherein the common source line and the bit line extend in orthogonal directions.

11. The vertical memory device of claim 1 further comprising:
    a tunnel insulation layer between the semiconductor channel and at least one of the plurality of word lines;
    a charge trapping layer on the tunnel insulation layer wherein the charge trapping layer is between the tunnel insulation layer and the at least one of the plurality of word lines; and
    a blocking insulating layer between the charge trapping layer and the at least one of the plurality of word lines.

12. The vertical memory device of claim 1 wherein the tunnel insulation layer comprises a continuous tunnel insulation layer between the semiconductor channel and the plurality of word lines.

* * * * *